US012571828B2

(12) United States Patent
Simpson et al.

(10) Patent No.: US 12,571,828 B2
(45) Date of Patent: Mar. 10, 2026

(54) SOLID STATE ELECTRIC FIELD SENSOR

(71) Applicants: The University of Melbourne, The University of Melbourne (AU); Royal Melbourne Institute of Technology, Melbourne (AU)

(72) Inventors: David Allan Simpson, Melbourne (AU); Nikolai Dontschuk, Melbourne (AU); Daniel James McCloskey, Melbourne (AU); Alastair Douglas Stacey, Melbourne (AU)

(73) Assignee: The University of Melbourne, Melbourne (AU)

( * ) Notice: Subject to any disclaimer, the term of this patent is extended or adjusted under 35 U.S.C. 154(b) by 117 days.

(21) Appl. No.: 18/289,520

(22) PCT Filed: May 4, 2022

(86) PCT No.: PCT/AU2022/050418
§ 371 (c)(1),
(2) Date: Nov. 3, 2023

(87) PCT Pub. No.: WO2022/232878
PCT Pub. Date: Nov. 10, 2022

(65) Prior Publication Data
US 2024/0241166 A1 Jul. 18, 2024

(30) Foreign Application Priority Data
May 5, 2021 (AU) ................................ 2021901331

(51) Int. Cl.
*G01R 29/12* (2006.01)
*C30B 29/04* (2006.01)
*C30B 31/22* (2006.01)

(52) U.S. Cl.
CPC .............. *G01R 29/12* (2013.01); *C30B 29/04* (2013.01); *C30B 31/22* (2013.01)

(58) Field of Classification Search
CPC ................ G01R 29/12; G01R 29/0885; G01N 33/48728; G01N 33/4836; G01N 21/64;
(Continued)

(56) References Cited

U.S. PATENT DOCUMENTS 9,766,181 B2 9/2017 Englund et al.
10,324,142 B2 6/2019 Hatano et al.
(Continued)

OTHER PUBLICATIONS

International Search Report and Written Opinion for corresponding PCT application No. PCT/AU2022/050418, dated Jun. 3, 2022.
(Continued)

*Primary Examiner* — Christopher P Mcandrew
(74) *Attorney, Agent, or Firm* — Nelson Mullins Riley & Scarborough LLP; Anthony A. Laurentano

(57) ABSTRACT

This disclosure relates to an electrical field sensor. The sensor comprises a diamond substrate with a conducting surface providing positive charge carriers and multiple defects disposed in the diamond substrate. The sensor further comprises an optical apparatus to initialise and readout the multiple defect vacancies to determine the electrical field based on a detected fluorescence of the multiple defects. The multiple defects are located at a depth below the surface to enable the positive charge carriers to reach and positively charge the multiple defect vacancies under an influence of an external negative electric field to thereby alter the fluorescence of at least some of the multiple defects. Since the fluorescence can be measured optically, no electrical connections or amplifiers are required on the surface, which means significantly higher densities of sensors can be implemented.

20 Claims, 14 Drawing Sheets

(58) Field of Classification Search
CPC ........... G01N 21/6489; G01N 21/6428; G01N 21/6486; G01N 2021/6434
USPC .......................................................... 324/457
See application file for complete search history.

(56) References Cited

U.S. PATENT DOCUMENTS

| | | | | |
|---|---|---|---|---|
| 10,338,162 | B2 * | 7/2019 | Reynolds ................ | G01R 33/26 |
| 2004/0051051 | A1 * | 3/2004 | Kato .................. | G01N 21/6452 |
| | | | | 250/458.1 |
| 2008/0097222 | A1 * | 4/2008 | Pertsov .................. | A61K 47/10 |
| | | | | 600/476 |
| 2008/0225272 | A1 * | 9/2008 | Nishimura ......... | G01N 21/6458 |
| | | | | 356/73 |
| 2017/0112380 | A1 * | 4/2017 | Jeong .................... | A61B 5/0075 |
| 2017/0212183 | A1 * | 7/2017 | Egan .................... | G01R 33/032 |
| 2018/0217064 | A1 * | 8/2018 | Kim .................... | G01N 21/6458 |
| 2019/0038177 | A1 * | 2/2019 | Duek .................... | A61B 34/20 |
| 2019/0154766 | A1 * | 5/2019 | Lutz .................... | G01R 15/245 |

OTHER PUBLICATIONS

Broadway, D. A. et al., "Spatial mapping of band bending in semiconductor devices using in situ quantum sensors," Nature Electronics, vol. 1, Sep. 13, 2018, pp. 502-507 (abstract, pp. 503-504, 506, Figure 1-3).

Hauf, M. V. et al., "Chemical control of the charge state of nitrogen-vacancy centers in diamond," Physical Review B, vol. 83, No. 8, Feb. 14, 2011, pp. 081304-1 through 081304-4 (pp. 4-9, Figures 2-4).

Sakakibara, Reyu, "Electrochemical Modulation of Fluorescence of Nitrogen Vacancy Centers in Nanodiamonds for Voltage Sensing Applications," Thesis: Massachusetts Institute of Technology, Department of Electrical Engineering and Computer Science, Feb. 2015, p. 24.

Reinhard, Friedemann, "Diamond defects detect what lies beneath," Nature Electronics, vol. 1, Sep. 2018, pp. 494-495, Figure 1.

Mccloskey, Daniel J. et al., "Enhanced Widefield Quantum Sensing with Nitrogen-Vacancy Ensembles Using Diamond Nanopillar Arrays," Applied Materials & Interfaces, vol. 12, No. 11, Feb. 26, 2020, pp. 13421-13427 (pp. 13421, 13422, Figure 1).

Bernardi, Ettore, et al., "Nanoscale Sensing Using Point Defects in Single-Crystal Diamond: Recent Progress on Nitrogen Vacancy Center-Based Sensors," Crystals, vol. 7, No. 5, Apr. 28, 2017, pp. 124-1 through 124-21, (p. 11, Figure 6).

Karaveli, Sinan, et al., "Modulation of nitrogen vacancy charge state and fluorescence in nanodiamonds using electrochemical potential," PNAS vol. 113, No. 15, Apr. 12, 2016, pp. 3938-3943 (pp. 3939, 3941, Figures 1, 5).

Krecmarova, Marie, et al., "A Label-Free Diamond Microfluidic DNA Sensor Based on Active Nitrogen-Vacancy Center Charge State Control," ACS Applied Materials & Interfaces, vol. 13, No. 16, Apr. 13, 2021, pp. 18500-18510.

Kawai, Sora, et al., "Nitrogen-Terminated Diamond Surface for Nanoscale NMR by Shallow Nitrogen-Vacancy Centers," the Journal of Physical Chemistry C, vol. 123, No. 6, Jan. 24, 2019, pp. 3594-3604.

Bian, KE, et al., "Nanoscale electric-field imaging based on a quantum sensor and its charge-state control under ambient condition," Nature Communications, vol. 12, Apr. 28, 2021, pp. 1-9.

* cited by examiner b)

a)

SOLID STATE ELECTRIC FIELD SENSOR

CROSS-REFERENCE TO RELATED APPLICATIONS

The present application claims priority from Australian Provisional Patent Application No 2021901331 filed on 5 May 2021, the contents of which are incorporated herein by reference in their entirety.

TECHNICAL FIELD

This disclosure relates to electric field sensors.

BACKGROUND

Electric field sensors are used in a wide range of applications and many different types of sensors are available for specific requirements from heavy industry, high voltage sensors to miniaturised, low voltage sensors. A particularly useful application of low voltage sensors is in the bio-medical field to measure the action potential of neurons, such as for brain activity measurements. However, most sensors are plagued with a maximum achievable sensor density. While it may be possible to reduce the active area of semiconductor devices, it is still necessary to connect the devices for read-out. With a higher density of devices, it becomes very difficult to connect them with metal connections without adding amplifiers to each sensor, which then limits sensor density because of the minimum possible sizes of these amplifiers.

Therefore, there is a need for an improved sensor architecture that enables high density integration.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each of the appended claims.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

This disclosure provides a sensor architecture based on fluorescent defects in diamond. The defects are located close to a positively doped surface of the diamond. Recombination occurs between the surface and the defects, which builds up a potential similar to a p-n junction. Due to the very short length of the p-n junction, the resulting electric field is very high, which causes the defects to develop electric charges different to their ordinary state were they not located inside such a junction. The number of charged defects depends on the external field strength and can be measured by detecting the resultant fluorescence, since the charge state of the defects changes their fluorescence. Since the fluorescence can be measured optically, no electrical connections or amplifiers are required on the surface, which means significantly higher densities of sensors can be implemented.

An electrical field sensor comprises:

a diamond substrate with a conducting surface providing positive charge carriers;

multiple defects disposed in the diamond substrate; and an optical apparatus to initialise and readout the multiple defects to determine the electrical field based on a detected fluorescence of the multiple defects;

wherein the multiple defects are located at a depth below the surface to enable the positive charge carriers to reach and positively charge the multiple defects under an influence of an external negative electric field to thereby alter the fluorescence of at least some of the multiple defects.

In some embodiments, the multiple defects comprise Nitrogen vacancies.

In some embodiments, the conducting surface comprises a layer of hydrogen that provides the positive charge carriers.

In some embodiments, the hydrogen is partially oxidised to increase a sensitivity of the electrical field sensor.

In some embodiments, the optical apparatus comprises a light source configured to excite the multiple defects and a photo sensor to sense light emitted by the multiple defects as a result of the fluorescence.

In some embodiments, the multiple defects are located at a depth of less than 7 nm below the surface.

In some embodiments, the multiple defects are disposed in the diamond substrate at a density of 3e20 cm3 to 1e19 cm3.

In some embodiments, the density is 2e20 cm3.

In some embodiments, the positive charge carriers are provided by the conducting surface at a density of at least 1e13 cm2.

In some embodiments, the diamond substrate and the conducting surface have a shape defining an array of protrusions and the optical apparatus is configured to readout each of the protrusions separately to obtain one intensity for each protrusion.

In some embodiments, the protrusions have a frustoconical shape.

In some embodiments, the protrusions are shaped with a density of protrusions of 510,000/mm2 or a resolution of 1.4 m.

A method for manufacturing an electric field sensor comprises:

providing a diamond substrate;

incorporating defects into the diamond substrate;

disposing a conducting surface providing positive charge carriers onto the diamond substrate with incorporated defects;

wherein disposing the conducting surface is performed with a process that avoids diffusion into the diamond substrate and maintains the defects that are located at a depth below the surface to enable the positive charge carriers to reach and positively charge the multiple defects under an influence of an external negative electric field to thereby alter the fluorescence of at least some of the multiple defects.

In some embodiments, the defects comprise nitrogen vacancies.

In some embodiments, disposing the conducting surface comprises exposing the diamond surface to a hydrogen plasma.

In some embodiments, exposing the diamond surface to the hydrogen plasma comprises protecting the diamond surface from impact of protons reacting with the defects.

In some embodiments, protecting the diamond surface comprises placing the diamond surface under a shield to protect the diamond surface.

In some embodiments, the shield comprises openings to provide for plasma flow to the diamond surface.

In some embodiments, the openings of the shield constitute tunnels having a length that is longer than a diffusion length of the protons.

In some embodiments, the method further comprises partly oxidising the conductive surface on the diamond substrate.

In some embodiments, partly oxidising the conductive surface comprises multiple iterations of: partly oxidising the conductive surface, and measuring a sensitivity of the electric field sensor, until a desired sensitivity is obtained.

A method for measuring an electrical field comprises:

exposing a diamond substrate with a conducting surface providing positive charge carriers to the electric field; and optically initialising and reading out multiple defects disposed in the diamond substrate to measure, by measuring a change in fluorescence, an increase in an amount of positively charged defects as a result of more positive charge carriers reaching the multiple defects due to the electric field.

Optional features provided above with reference to one of the aspects of sensor and method are to be understood to be optional features for the other aspects as well.

BRIEF DESCRIPTION OF DRAWINGS

An example will now be described with reference to the following drawings.

DESCRIPTION OF EMBODIMENTS

Figure 1:
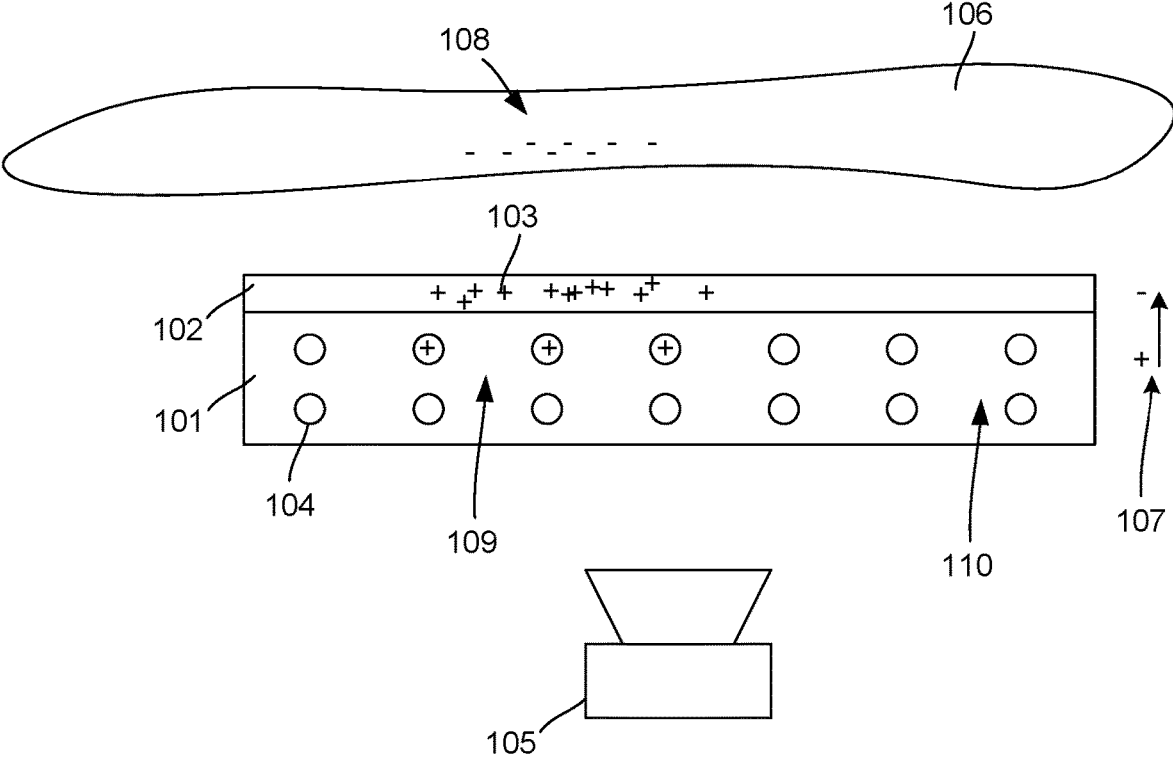
FIG. 1 illustrates an electrical field sensor.

FIG. 1 illustrates an electrical field sensor 100. Sensor 100 comprises a diamond substrate 101 with a conducting surface 102. Conducting surface 102 is positively (p) doped to provide positive charge carriers. In other words, there is a surplus of p carriers 103 in surface 102.

Multiple Nitrogen vacancies (NVs) 104 are disposed in the diamond substrate 101, noting that other defects, such as Silicon (Si) vacancies may equally be used. An optical apparatus 105 initialises and reads out the multiple NVs 104 to determine the electrical field based on a detected fluorescence of the multiple NVs 104. The multiple NVs 104 are located at a depth below the surface 102 to enable the positive charge carriers 103 to reach and positively charge the multiple defects 104 under an influence of an external negative electric field to thereby reduce the fluorescence of at least some of the multiple defects 104.

Where the surface 102 contacts the substrate 101, the concentration gradient of holes between the surface 102 and the substrate leads to a movement of holes into the substrate and a recombination of holes with electrons of the NV centres. As a result, the holes leave behind a negatively charged hydrogen surface and the electrons leave behind a positively charged NV. This results in a build-up of an electric potential 107 that counteracts further movement and recombination. At that stage, the device is in a stable state. While the electric potential 107 could be measured, it is not used as a measurement variable. It is noted, however, that the electric potential 107 occurs over a very short distance, which results in a very strong electric field.

This also means that the number of positively charged NVs 104 diminishes quickly with depth, that is, with the distance from the surface 102. In terms of notation, after recombination of an electron with a positive charge carrier, the positively charged NV is denoted as NV+. Neutral NVs without recombination are also referred to NV0 to avoid ambiguity. An NV+ is significantly less fluorescent (or even completely dark) than an NV0 when pumped with the same frequency. For completeness, there may also be negatively charged NVs, which are denoted as NV−. NV− are also fluorescent but at a different frequency than NV0.

In other words, when the device is in the stable state, there is a thin layer of shallow NVs that are in the NV+ charge state. This layer may be referred to as depletion layer or depletion zone. The remaining NVs are NV0 or NV−. So when fluorescence is measured, only the newly NV+, generated as a result of the electric field, contribute to a contrast between different external electric fields. NVs that are too deep for recombination (NV0, NV−) are always fluorescent and therefore add a "background light" which reduces sensitivity. So it is an advantage to keep the layer of NVs shallow, such as less than 20 nm. In general, the weaker the external electric field to be measured is, the thinner the layer of NVs ought to be up to a point where the layer is so thin that all NVs are in the NV+ state. In that case, there could not be any change as no further NV+ could be generated.

It is further noted that, as described above, NVs change between 'bright' states (NV0, NV−) to a 'dark' state (NV+) and the resultant change in fluorescent brightness determines the measured electric field. In another example, where silicon is used, the negative and neutral charge states SiV− and SiV0 are both fluorescent but at a different frequency. So the optical apparatus 105 would determine the fluorescence at one of more of those frequencies to determine the electrical field.

FIG. 1 also shows a neuron 106 and the aim is to measure an electric field emitted from neuron 106. As will be explained in more detail below, if the neuron 106 provides a negative electric field, as shown at 108 in FIG. 1, the positive charge carriers 103 are attracted to the neuron as shown in FIG. 1. As a result, near the field from the neuron, roughly indicated at 109, more positive charge carriers 103 are available for recombination with NVs 104 and more NV+ and fewer NV0 will be present. Therefore, fluorescence is low. Elsewhere, where the neuron 106 provides no electric field, positive charge carriers 103 are less prevalent and recombination with NVs occurs less, resulting in fewer NV+ and higher fluorescence, roughly indicated at 110. Optical apparatus 105 measures the fluorescence, which can then be used to calculate the electric field.

It is noted that the sensitivity of the sensor 100 can be improved by increasing the density of NVs 104 in the diamond substrate 101. But an increased density of NVs in diamond would typically lead to more NV− and less opportunities for recombination to form NV+. However, in FIG. 1 the close proximity of the NVs 104 to the surface 102 leads to very short distance between positive and negative charges. As a result, the electric field is very strong, which leads to a high number of NV+. This provides a high sensitivity that is difficult to achieve with deeper NVs due to the almost total absence of NV+ in deeper regions.

Example Parameters

In one example, the surface provides positive charge carriers due to the hydrogen termination on an n-type diamond, doped with substitutional nitrogen.

In one example, the N-type nitrogen doped layer extends from the diamond surface to between 7 nm and 50 μm into the diamond. That is, the n-type layer has a thickness of between 7 nm and 50 μm.

In another example, the n-doped layer is 7 nm thick.

A thicker n-type nitrogen layer should not have a catastrophic effect on the device but may gradually reduce the contrast but the surface NVs still change charge state to provide a difference in fluorescence. In other words, the shallower the NVs are, the higher the sensitivity of the sensor.

As explained above, there is a recombination of positive charge carriers and NV centres which creates an opposing electric field to counteract further recombination. In analogy with PN junctions, the area where the NV centres have recombined can be referred to as the "depletion zone". That depletion zone is what provides NV+ centres and therefore sensitivity to an electric field. It is therefore desirable to design the sensor so that the depletion zone is exactly the same as the zone where NVs are present. That is, all NVs have recombined and the depletion zone would not extend further if further NV centres were present. However, an exact match is difficult to achieve practically and a small excess of NVs results in only a small reduction in sensitivity. On the other hand, too little NVs would mean small changes in electric field could not be detected. Therefore, the design would be on the safe side with a small excess of NVs that are outside the depletion zone. It is further noted that the depth of the depletion zone depends on the density of NVs since the density determines the number of recombination and therefore the static electric field opposing further recombination. So the design parameters include depth of NVs as well as density of NVs. Therefore, the optimal design would have a depth and a density such that almost all NVs are recombined at a zero external electric field.

If the NVs are at greater depth, a lower density can be used. Vice versa, a higher density would mean a shallower implantation.

In one example, the density of substitutional nitrogen is between 3e20 cm−3 to 1e19 cm−3. In one example, the density is 2e20 cm−3.

Some combinations include (noting that other combinations are equally possible):

| Density (cm−3) | Depth | Density (cm−3) | Depth | Density (cm−3) | Depth |
|---|---|---|---|---|---|
| 3.00E+20 | 7 nm | 3.00E+20 | 500 nm | 3.00E+20 | 10 um |
| 2.00E+20 | 7 nm | 2.00E+20 | 500 nm | 2.00E+20 | 10 um |
| 1.00E+19 | 7 nm | 1.00E+19 | 500 nm | 1.00E+19 | 10 um |
| 3.00E+20 | 50 nm | 3.00E+20 | 1 um | 3.00E+20 | 25 um |
| 2.00E+20 | 50 nm | 2.00E+20 | 1 um | 2.00E+20 | 25 um |
| 1.00E+19 | 50 nm | 1.00E+19 | 1 um | 1.00E+19 | 25 um |
| 3.00E+20 | 100 nm | 3.00E+20 | 10 um | 3.00E+20 | 50 um |
| 2.00E+20 | 100 nm | 2.00E+20 | 10 um | 2.00E+20 | 50 um |
| 1.00E+19 | 100 nm | 1.00E+19 | 10 um | 1.00E+19 | 50 um |

Nitrogen vacancies (NV) and silicon vacancies (SiV) have both been demonstrated to work as fluorescent reporting defects. The fluorescent defect ensembles tested extend from 2 nm to 35 nm, with densities ranging from 1e17 cm3 to 1e19 cm3. Best sample is NV, with 7 nm NV with a density of approximately 2e18 cm3.

In one example, the hydrogen termination is of sufficient quality to provide more than 1e13 cm2 charge carriers (holes).

Example Device

This disclosure provides a dense array of diamond near-surface p-n junction devices containing embedded fluorescent reporters of local gate potential. This scheme circumvents the need for any on-chip amplification or readout electronics, thereby enabling nearly optical-resolution limited solution potentiometry. We report the realization of an example diamond charge-state optrode (DCSO) voltage sensor array with a 1.4 μm resolution (probe density ≈510,000/mm2) capable of real-time, widefield imaging of local changes in solution potential. To demonstrate the utility of the technique, we perform single-shot imaging of field-potential (FP) activity in acute mouse CA1 hippocampus slices.

Measurement Principles

This disclosure describes a monocrystalline substrate containing a shallow NV ensemble. The fluorescence response of the diamond field-effect devices depends only on transitions between the NV0 and the non-fluorescent NV+ states despite the high density of implanted nitrogen, thereby overcoming the contrast limitations imposed by the spectral overlap between the NV− and NV0 emission bands. To create a uniform sensing surface suitable for imaging, the sensor comprises an electronic-grade single crystal diamond substrate and shallow n-type doping by high-dose implantation of nitrogen ions at 2 keV followed by annealing to convert approximately 1% of the implanted nitrogen to fluorescent NV centers. To further increase sensitivity, the diamond surface is patterned with an array of frustoconical nanopillar structures by reactive ion etching to maximize fluorescence collection, resulting in an array of optical diamond electrodes, or "optrodes".

Figure 2:
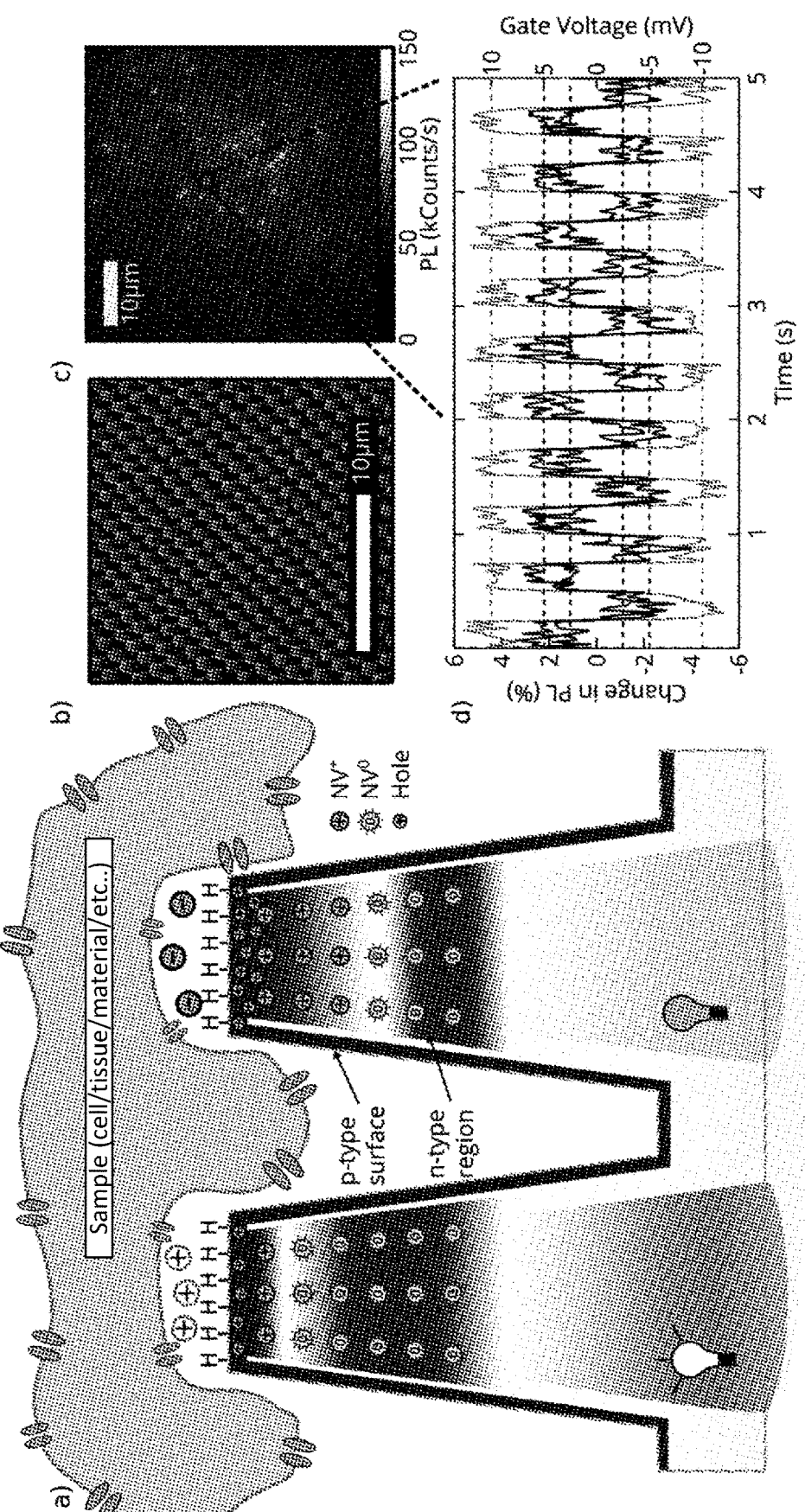
FIG. 2: Solution voltage sensing using diamond charge-state optrodes. a) Recording scheme. An electrically-active sample sits atop a diamond substrate with a conductive p-type surface and an n-type near-surface region containing nitrogen-vacancy (NV) ensembles. Fluorescence excitation and collection is performed from below. An excess of positive ions (left) drives holes from the surface and increases the population of NV0 centers, boosting fluorescence emissions. A buildup of negative ions (right) draws in compensatory holes, some of which are captured by NV0 centers, converting them to NV+ and reducing fluorescence emissions. Nanopillar structures increase light collection but are not necessary for the technique. b) Scanning-electron micrograph of a fabricated diamond charge-state optrode array. c) Fluorescence image of the same optrodes as shown in b). d) Unfiltered PL time-traces from a single optrode in response to applied square-wave solution gate potentials.

A change in the solution potential causes mobile (hole) charges confined to the first few nanometers of the diamond surface to rearrange in order to screen the penetration of the external field into the diamond bulk. Due to hole-capture by NV0, an increase in the density of holes leads to a commensurate decrease in the NV0 population, while a decrease in hole density allows the 532 nm continuous wave (CW) illumination laser to pump a larger number of NV+ defects back into the NV0 state (FIG. 2a). In the language of semiconductor physics, the NV ensemble charge-state population reports the depletion width of a near-surface p-n junction formed between the hydrogenated p-type surface and the n-type implanted nitrogen layer. By localising these p-n junctions within well-ordered nanopillar arrays, the sensor takes advantage of the ten-fold increase in optical signal from near-surface ensembles resulting from the waveguiding properties of the pillar geometry, and the compatibility of diamond nanopillars with cultured cell networks also offers the future possibility of increased electrical signals due to the seal resistance formed by the intimate contact of the cell membrane with these structures. Our realised DCSO arrays (FIG. 2b) exhibit uniform intrinsic brightness, which facilitates their use in fluorescence imaging with wide-field laser illumination (FIG. 3c). Local changes in solution potential can then be extracted and imaged via relative changes in fluorescence emissions from single pillars (FIG. 2 d).

Device Characterisation

To characterise the response of the DCSO chip to external potentials, we constructed a solution-gating apparatus which allows for simultaneous wide-field flourescence microscopy. The apparatus consists of a planar platinum electrode patterned on a glass coverslip and enclosed with a silicone rubber fluid well (FIG. 3a). Measurements were performed using a home-built widefield fluorescence microscope by exciting with a 532 nm laser and imaging photoluminescence (PL) emissions from the NV centres through a 580 nm long-pass filter onto an sCMOS camera or benchtop spectrometer. A signal generator was used to apply gate potentials between the diamond surface and the platinum electrode. Spectra were taken at gate potentials ranging from −300 mV to 300 mV (FIG. 3b). We observe a monotonic response of the PL intensity to gate voltage, and after taking the difference of each spectrum from that obtained at 0 V find no evidence of contribution to the signal from the negative NV charge-state (FIG. 3c).

The ultimate sensitivity of the device may depend on the fluorescence contrast response, specifically the relative change in optical signal intensity per unit difference in potential. To determine the fluorescence contrast for imaging on the experimental setup, square-wave signals were applied while videos of the resulting fluorescence emissions were recorded on an sCMOS camera. We found that the contrast response exhibits a saturating dependence on optical power density (FIG. 3d). As the excitation power density at the NV layer is enhanced due to waveguiding by the pillars, this effect likely explains the improved contrast we observed from submicron pillars compared to larger structures. We also found a linear approximation of the voltage response to small signals (<25 mV amplitude, well in excess of the expected extracellular voltage change for biological recording) was justified across the whole range of excitation power densities tested (FIG. 3e), allowing to extract a maximal field-of-view averaged PL contrast of 0.44%/mV on our setup (FIG. 3e inset).

Imaging Calibration and Sensitivity

Figure 3:
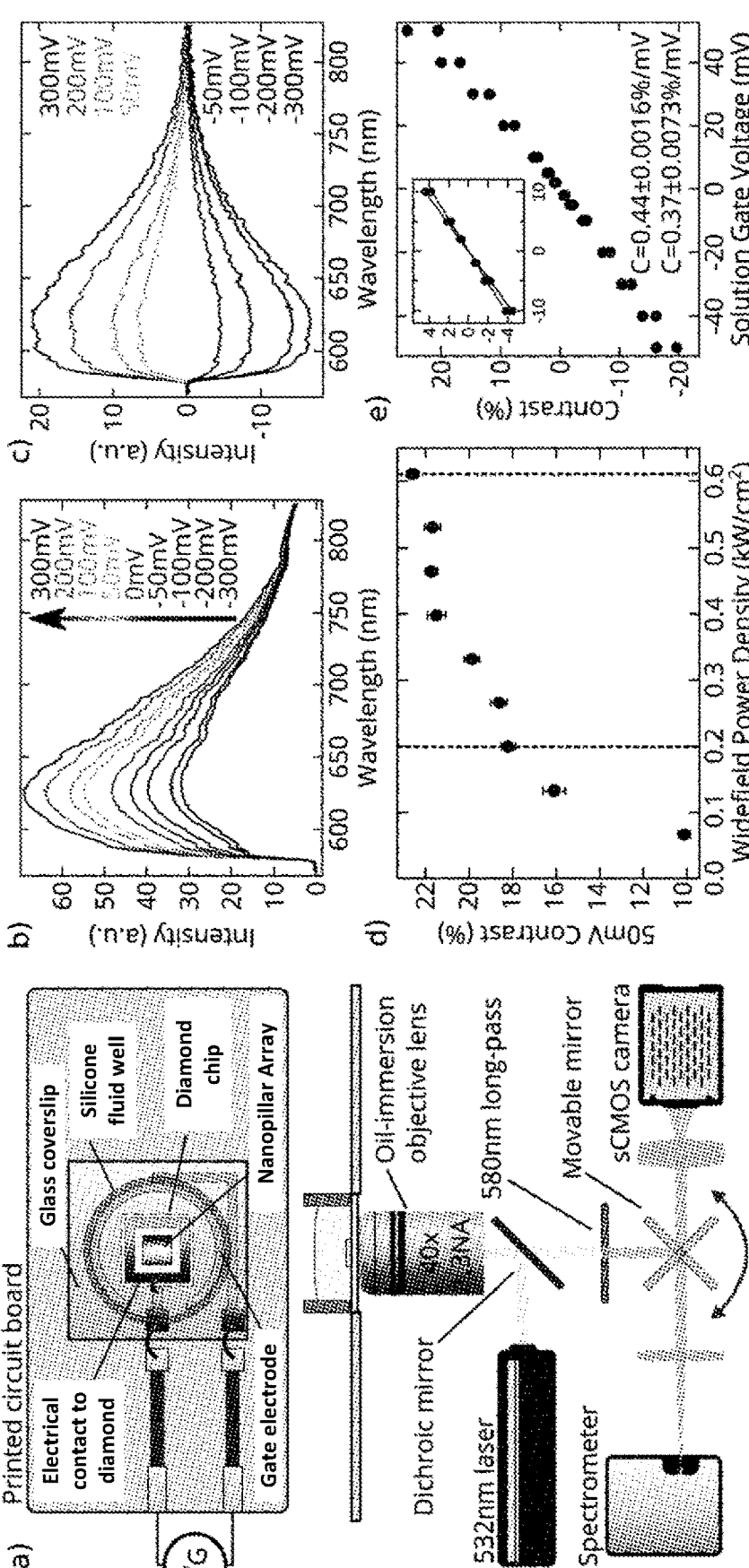
FIG. 3: Characterisation of diamond charge-state optrode array. a) Schematic of the apparatus constructed to measure the photoluminescence (PL) response of the optrodes. b) PL spectra measured for solution gate potentials from −300 mV to 300 mV. Note that the NV0 zero-phonon line at 575 nm is absent due to our use of a 580 nm long-pass filter. c) Differences of the spectra in panel b) from the spectrum obtained at 0 mV. d) Photoluminescence contrast as a function of 532 nm laser power density. e) Linear PL contrast response of the NV ensemble as a function of gate potential.
Figure 4:
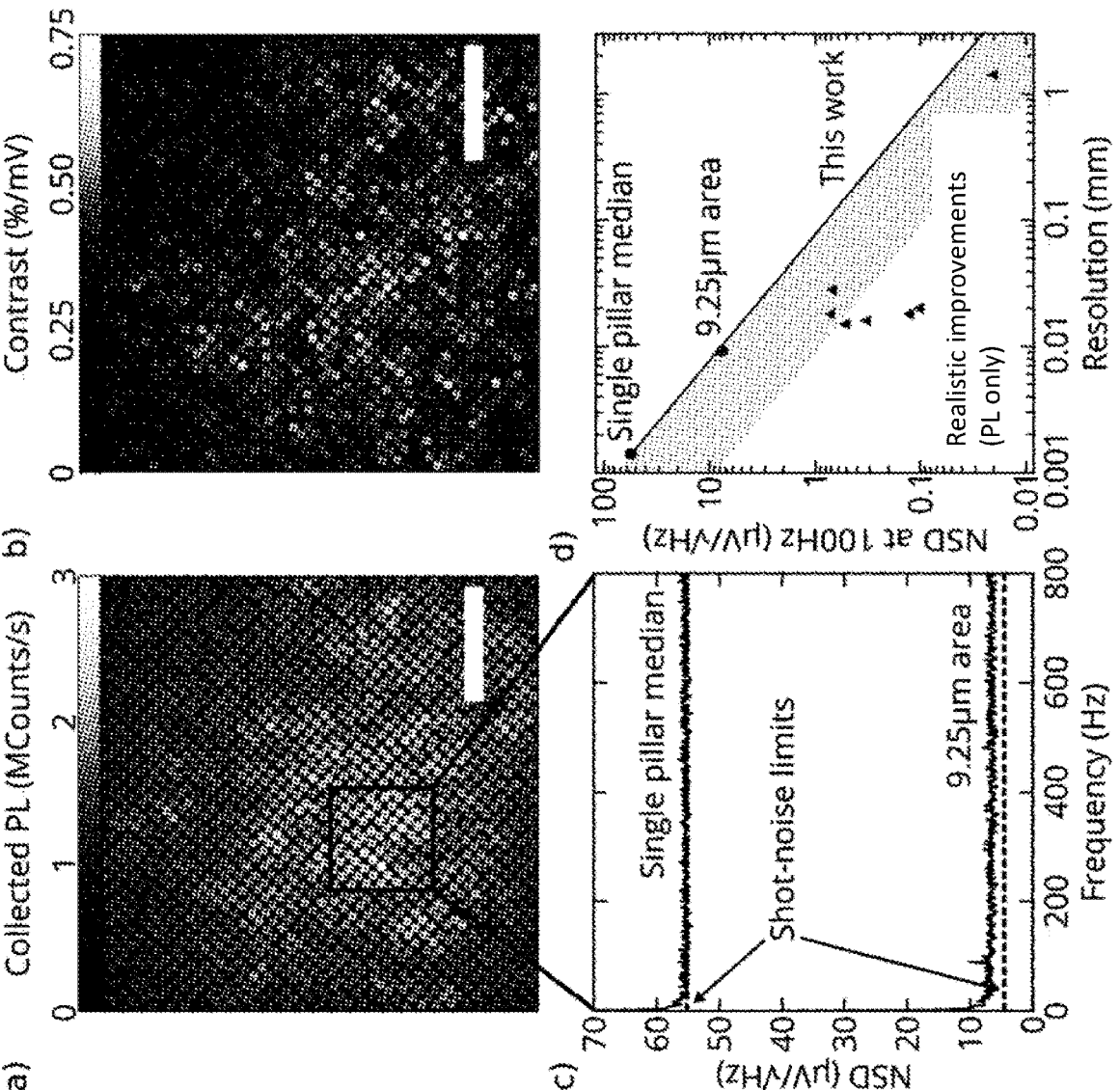
FIG. 4: Calibration of Device and Sensitivity Limits. a) Map of total collected fluorescence from a section of pillars after binning pixels belonging to individual pillars with a circular Hough transform circle-finding algorithm (Matlab). b) Map of the fluorescence contrast response of each pillar in the imaging field, allowing the conversion of percent changes in PL to voltage at each pillar site. c) Noise power spectral densities (PSDs) measured from a small area of pillars located at the center of the excitation laser spot using our sCMOS camera, showing the median spectrum measured for a single pillar (96 pillars measured in total) and that obtained for the whole imaged area. Theoretical photon shot-noise limits are indicated by dashed lines. d) Comparison of our obtained noise PSDs at 100 Hz to other methods, accounting for the increase in sensitivity of our chip with reduced resolution (pixel binning) under the assumption of spatially homogenous illumination. Blue circles are measured data from panel c), the red line (upper) extrapolates our single-pillar median sensitivity to lower spatial resolutions, and the green shaded area (lower) shows the expected performance range of a future device with improved photon collection rates from the optrodes (not considering the positive effects of possible future contrast enhancements), with maximal sensitivity achieved with 75% conversion of implanted N ions to NV centers (75 times more fluorescence emission per pillar). Scale bars are 10 μm.
Figure 5:
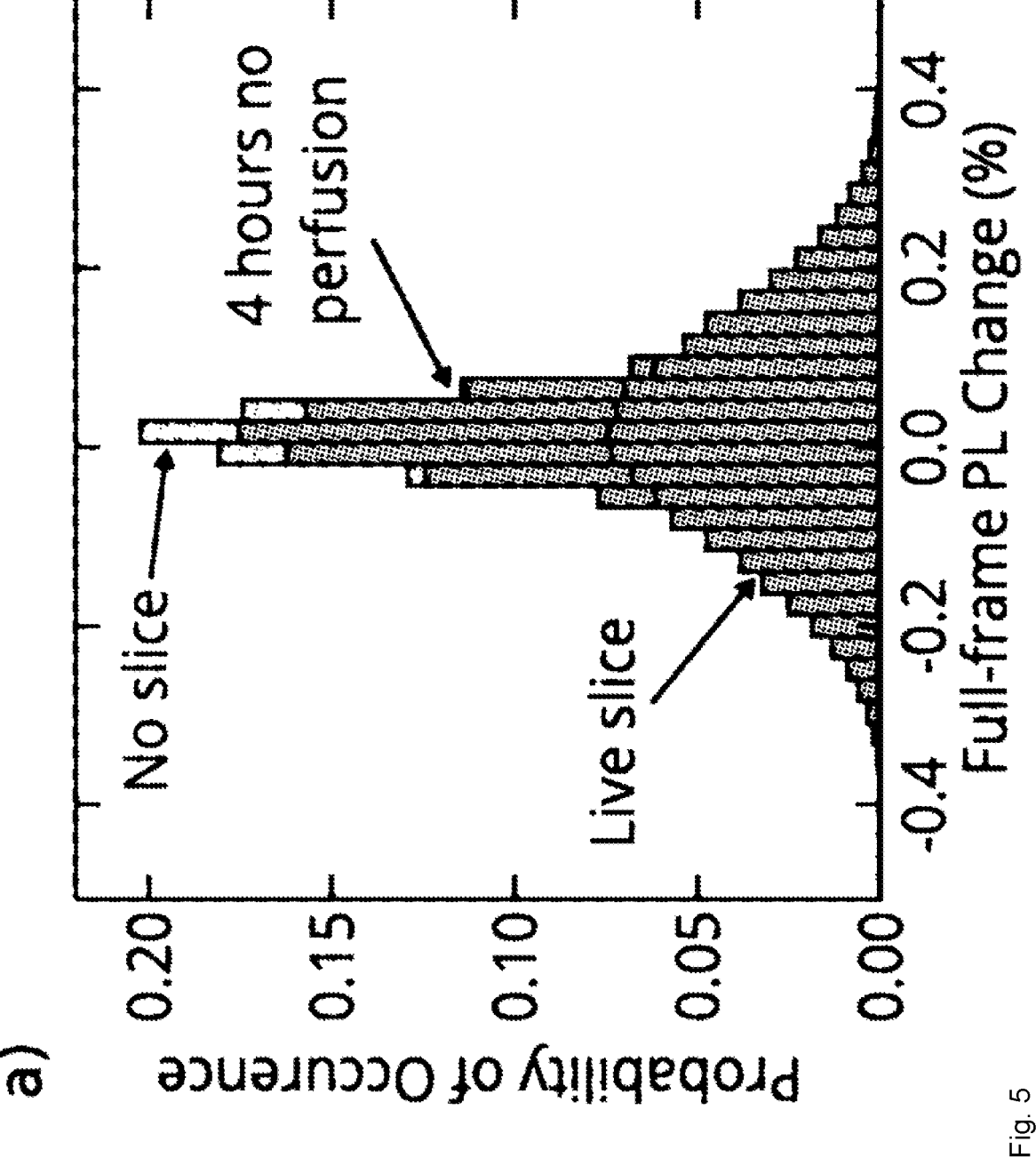
FIG. 5: Recording of electrical activity from acute mouse brain slices. a) Histogram showing a significant increase in fluorescence noise when a living brain slice is in contact with the diamond chip, indicative of the background electrical activity of the slice being picked up by the charge-state sensor.
Figure 6:
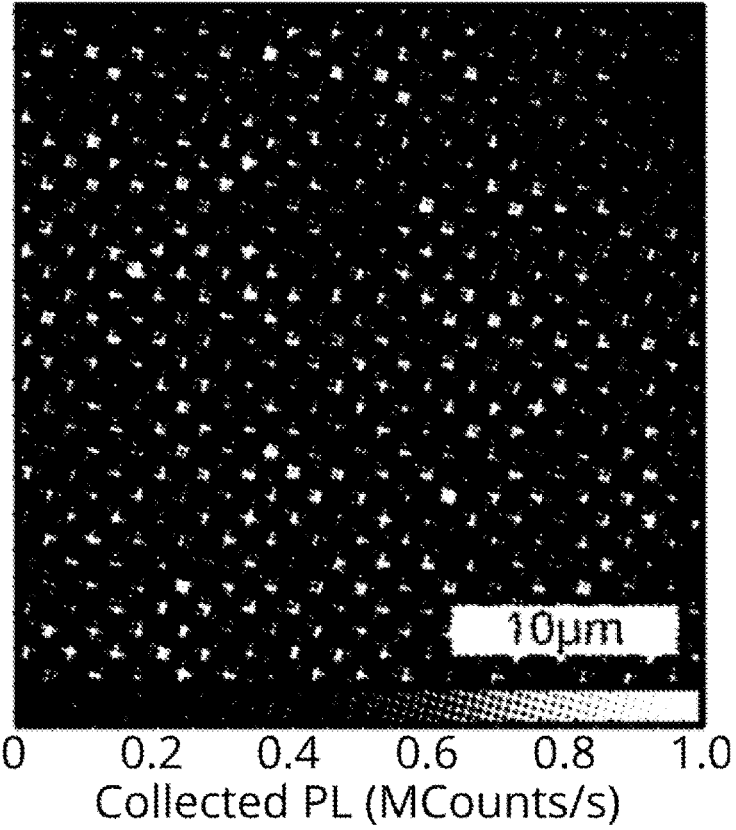
FIG. 6 shows a scanning confocal PL image of a fabricated fluorescent pillar array. 532 nm excitation was used with a diffraction-limited spot size of roughly 250 nm, providing an excitation power density of roughly 8 kW/cm2. Collection was performed through the same 580 nm long-pass filter described herein.
Figure 7:
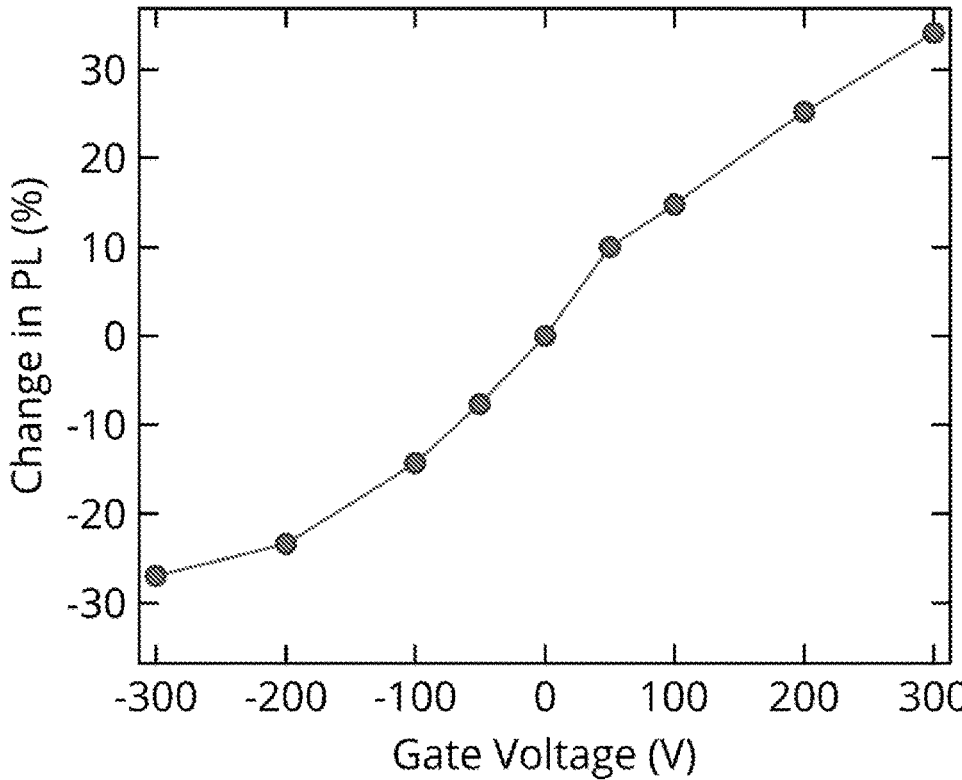
FIG. 7 shows integrated photoluminescence contrast as extracted using a fibre-coupled spectrometer. Changes in fluorescence are less than those reported below because the spectrometer captures emissions from the entire excitation laser spot, where the lower power densities away from the center of the spot lead to contributions from areas with reduced contrast.
Figure 8:
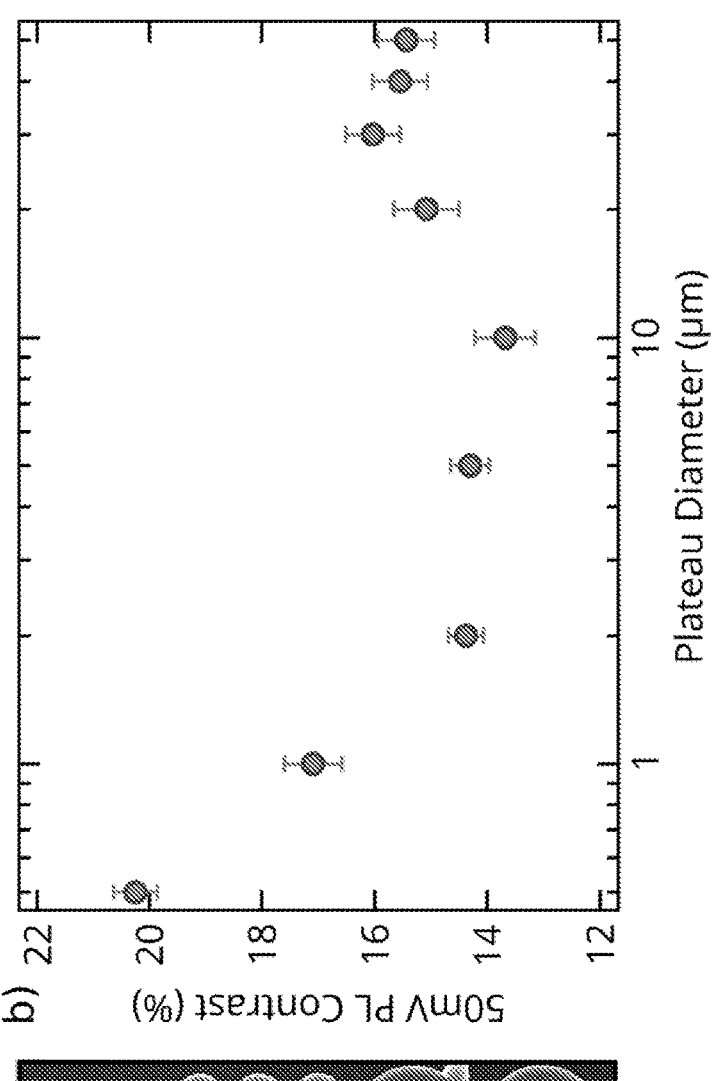
FIG. 8 illustrates the fluorescence contrast effect of diamond plateau diameter. a) Scanning electron micrograph of the fabricated plateau structures used, which span two orders of magnitude in diameter from 50 μm to 500 nm. The bow-tie and stripline structures in the top left were not used in this work. b) Photoluminescence contrast for a fixed square wave amplitude of 50 mV as a function of diamond plateau diameter. No strong dependence on diameter is observed until 1 μm, likely the result of the pillar structures focusing the excitation laser, resulting in higher local power density at the pillar tip and hence increased contrast.
Figure 8:
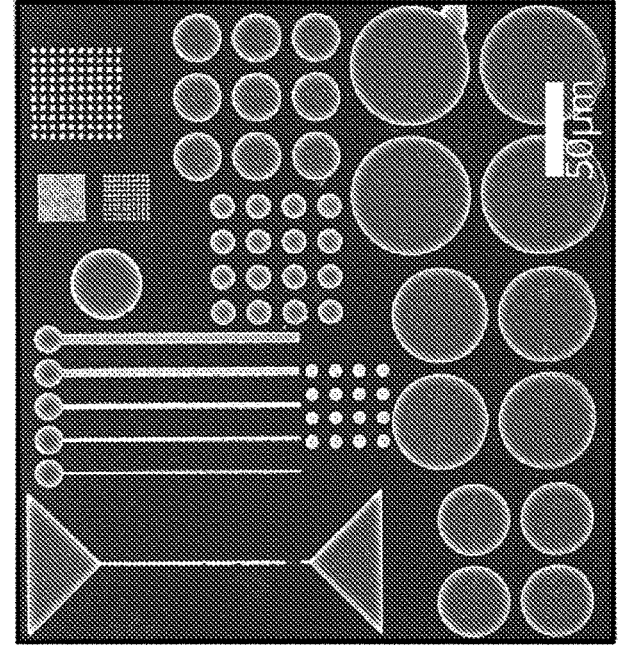
Figure 9:
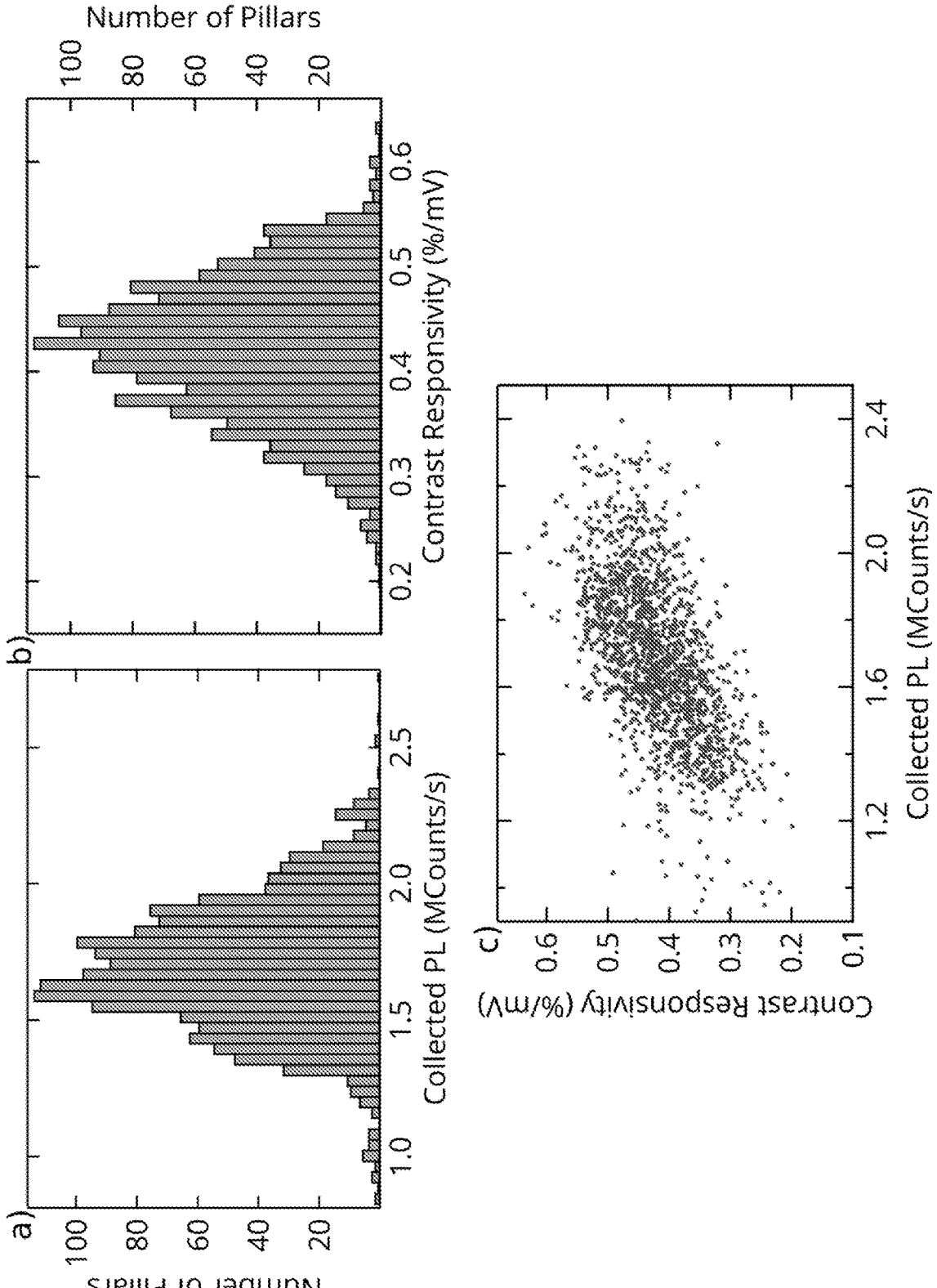
FIG. 9 illustrates statistics for the area of pillars as measured. a) Collected photoluminescence count rates, showing a mean of 1.69 MCts/s and median of 1.68 MCts/s on the measured area. b) Individual pillar contrasts across the measured area, showing both a mean and median of 0.42%/mV. c) Scatter plot showing a positive correlation between collected PL (which depends on excitation power density) and contrast, in agreement with the FOV-averaged dependence of contrast on incident optical power density shown herein.

A custom image processing script was produced to bin image pixels corresponding to individual optrodes (FIG. 4a) and extract the voltage response of each to produce a calibration mapping, allowing the conversion of fractional brightness change directly to voltage at each site (FIG. 4b). To examine the primary sources of noise in the technique, we performed recordings over a restricted FOV (128×128 pixels) at the maximum possible frame rate of our camera (roughly 1600 frames-per-second) with no signal applied between the DCSO chip and the Pt reference electrode. We binned the pixels corresponding to individual pillars (96 pillars total) and extracted power spectral densities using the individual contrast values obtained for each pillar. Taking the mean of these spectra, the resulting average single-pillar power spectrum (FIG. 4c) shows an essentially flat frequency response up to the Nyquist limit of our measurement, with a small fall-off at low frequencies (<10 Hz) likely owing to the interaction between the optrode surface and the electrolyte solution. Solution voltage recording electrodes typically display an inverse fall-off of noise with frequency due to electronic effects, which suggests that a different source of noise dominates the proposed system at present. The shot-noise limited sensitivity for each optrode, can be given by $$\eta = \frac{1}{C\sqrt{R}} \tag{1}$$

where C is the pillar contrast and R is the photon count-rate, and obtained a median shot-noise limited sensitivity value of 55 $\mu$V/$\sqrt{Hz}$ per optrode. This is the same as our measured noise floor and leads us to conclude that photon shot-noise is indeed the dominant noise contribution. The sensitivity can be written as:

$$\eta = \frac{1}{C\sqrt{R}} = \frac{1}{C\sqrt{A\rho_p R_p}} \tag{2}$$

where $R_p$ is the photon count-rate for a single pillar, $\rho_p$ is the areal density of pillars, and A is the area over which fluorescence is integrated (i.e. the square of the desired spatial resolution), and using a value of $$\rho_p = \left(\frac{1}{1.4 \text{ m}}\right)^2$$

due to the 1.4 $\mu$m pillar pitch on our sample, we can compare the sensitivity of our device with both CMOS and passive MEAs (FIG. 3 d, red line).

Although the DCSO device reported here is an early prototype to utilise charge-state based potentiometric imaging, the proposed technique is not far from the sensitivities offered by modern CMOS MEAs, and similarly predict nearly equivalent sensitivities to passive MEAs when scaled to millimeter resolutions. In addition, increasing the spatial resolution of the system beyond 1.4 μm is well within the capabilities of existing nanofabrication processes. As the disclosed device is presently limited by photon shot-noise, one path to increased sensitivity is to increase fluorescence emission and collection from the pillars. A combination of a higher nitrogen implantation density, a more optimal illumination wavelength for exciting the NV0 center, and an improved nitrogen-to-NV conversion ratio are all paths to brighter optrodes. Given that appropriate co-doping of diamond can lead to nitrogen-to-NV conversion ratios in implanted layers of 75% (75 times the conversion ratio), a realistically achievable range of future device sensitivities is indicated in the shaded area of FIG. 4, which are commensurate with modern CMOS MEAs (FIG. 4*d*, black triangles) but offering more than one order of magnitude higher resolution and a far higher number of individual probes on a given surface area (roughly 510,000 probes per mm2 with the 1.4 μm spacing). These estimated improvements are made without consideration of possible future improvements to the fluorescence contrast C, which would result in even higher sensitivities.

Electrode Potential Mapping and Single-Shot Imaging of Acute Mouse Brain Slice Activity We confirmed that the device enables localised measurements of solution potentials by affixing an acute mouse brain slice with a thickness of 300 μm and a diameter of 5 mm to the diamond chip.

SUMMARY

This disclosure provides an example of an sensor for all-optical imaging of voltages in solution with a resolution of 1.4 μm using the fluorescence modulation of ultrashallow nitrogen-vacancy ensembles caused by changes in their charge-state populations between the neutral NV0 and non-fluorescent, positive NV+ states. The disclosed monolithic diamond charge-state optrode array exhibits shot-noise limited sensitivity which is within striking distance of modern CMOS MEAs when used at the same imaging resolution, as well as being readily scalable to more than half a million functional probes per mm2 of chip area. This technology enables higher-resolution electrohysiology studies in vitro, allowing hundreds of probes to sample the dynamics across individual neurons while also facilitating access to the whole network. In addition, the complete transparency of the diamond recording array readily offers the possibility of integration with fluorescent dyes for correlated electrical-structural imaging, as well as with optogenetic techniques for all-optical stimulation and recording.

While the examples above use nitrogen vacancies, other photoactive defects in diamond may be suitable for optrode designs, such as the silicon, germanium, and tin-vacancy centers, as well as the single-vacancy (GR1) defect. In particular, the silicon-vacancy center can be operated entirely in the infrared and can undergo reversible, electrically controlled charge-state conversion. Combined with the benefit of not introducing n-type donors to the diamond, thereby reducing the p-type surface conductivity, this defect is an attractive candidate for future generations of diamond charge-state optrode array systems.

Sample Preparation

An electronic-grade diamond wafer produced by chemical-vapour-deposition (Element Six) was used. After cleaning by boiling in a mixture of sulphuric acid and sodium nitrate, the sample was implanted with 14N ions at 2 keV with a fluence of 1013 cm−2 at an incidence angle of 7 (InnovIon) and annealed in vacuum at 1100° C. for 4 hours to create a near-surface layer of NV centres. The sample was then cleaned a second time using the same acid-boiling procedure, and nanopillar structures were fabricated using standard electron-beam lithography, metallization, and oxygen reactive-ion-etching processes as described in Daniel J. McCloskey, Nikolai Dontschuk, David A. Broadway, Athavan Nadarajah, Alastair Stacey, Jean-Philippe Tetienne, Lloyd C. L. Hollenberg, Steven Prawer, and David A. Simpson. Enhanced widefield quantum sensing with nitrogen-vacancy ensembles using diamond nanopillar arrays. *ACS Applied Materials & Interfaces,* 12(11): 13421-13427, March 2020.

A titanium/platinum stack 15/50 nm thick was used to create an electrical contact to the diamond surface. The sample was then hydrogen-terminated by exposure to a pure hydrogen plasma in a diamond-growth CVD reactor (AsTeX). The sample was mounted to the planar electrochemical cell using a biocompatible and optically-transparent epoxy resin (EpoTek 301) and contacted with conductive silver epoxy which was then sealed using biocompatible liquid silicone rubber.

Sample Characterisation and Data Analysis

The solution used to characterise the device was a PBS solution diluted from a 10× concentrated stock solution from Gibco (Thermo Fisher Australia). The final concentration was 137 mM NaCl, 10 mM Phosphate, 2.7 mM KCl, pH 7.4, and osmolality of 280-310 mOsm/kg. For all fluorescence measurements, we used an oil-immersion objective with 40× magnification and an NA of 1.4. Spectroscopy was performed with an OceanInsight Flame series spectrometer, and fluorescence video was recorded using an ANDOR Neo sCMOS camera which was thermoelectrically and water cooled to −40° C. For chip characterisation, video data were processed using custom Matlab scripts to produce time-traces for each pillar in the imaging field and extract PL contrasts (relative change in the PL from that at 0 V applied) for each applied signal amplitude. The dependence of NV PL contrast on optical power density was investigated using 2 Hz square wave signals with a fixed amplitude of 50 mV and no DC offset, while signals of the same frequency but with varying amplitudes and DC offsets (offset such that one edge of the square wave was always at 0 V) were used for investigating the response to different applied potentials.

Acute Brain-Slice Measurements

After excision, the brain slice was transferred to the recording well with a 3 mL transfer pipette and affixed to the diamond surface using a custom-made harp. Artificial cerebro-spinal fluid was bubbled with 95% O2 and 5% CO2 gas and circulated through the silicone well a rate of 2 mL per minute using peristaltic pumps both for perfusion and suction.

Surface Doping

As mentioned above in relation to FIG. 1, diamond substrate 101 has a conducting surface 102 that may be made conducting by the deposition of hydrogen, for example, to provide positive charge carriers. As also described above, the positive charge carriers may be provided to the conducting surface 102 by way of exposure to a pure hydrogen plasma in a diamond-growth CVD reactor. Since this step provides positive charge carriers, it can also be referred to as a doping step.

A 'pure' hydrogen plasma is a plasma that is substantially free of other parts. A particular concern may be protons that are also emitted by common hydrogen plasma sources. In most applications, those protons are not of a major concern since near-surface NVs are not relied upon. Here, however, the near-surface NVs provide most of the sensitivity. However, protons are typically high-energy and can react with the NVs when the protons impact the diamond substrate 101. Such a reaction will essentially destroy the NVs, which would, in turn, reduce the sensitivity of the sensor. Further, the passivated NV defects supress the fluorescence of nearby un-passivated NV centres, which means it may not be possible to produce useful sensitives (for biological applications) with such a device.

As a solution to that problem, it is possible to protect the diamond surface from impact of protons reacting with the defects during plasma exposure. This can be achieved by placing the diamond surface under a shield to protect the diamond surface from the protons.

Figures 10, 11:
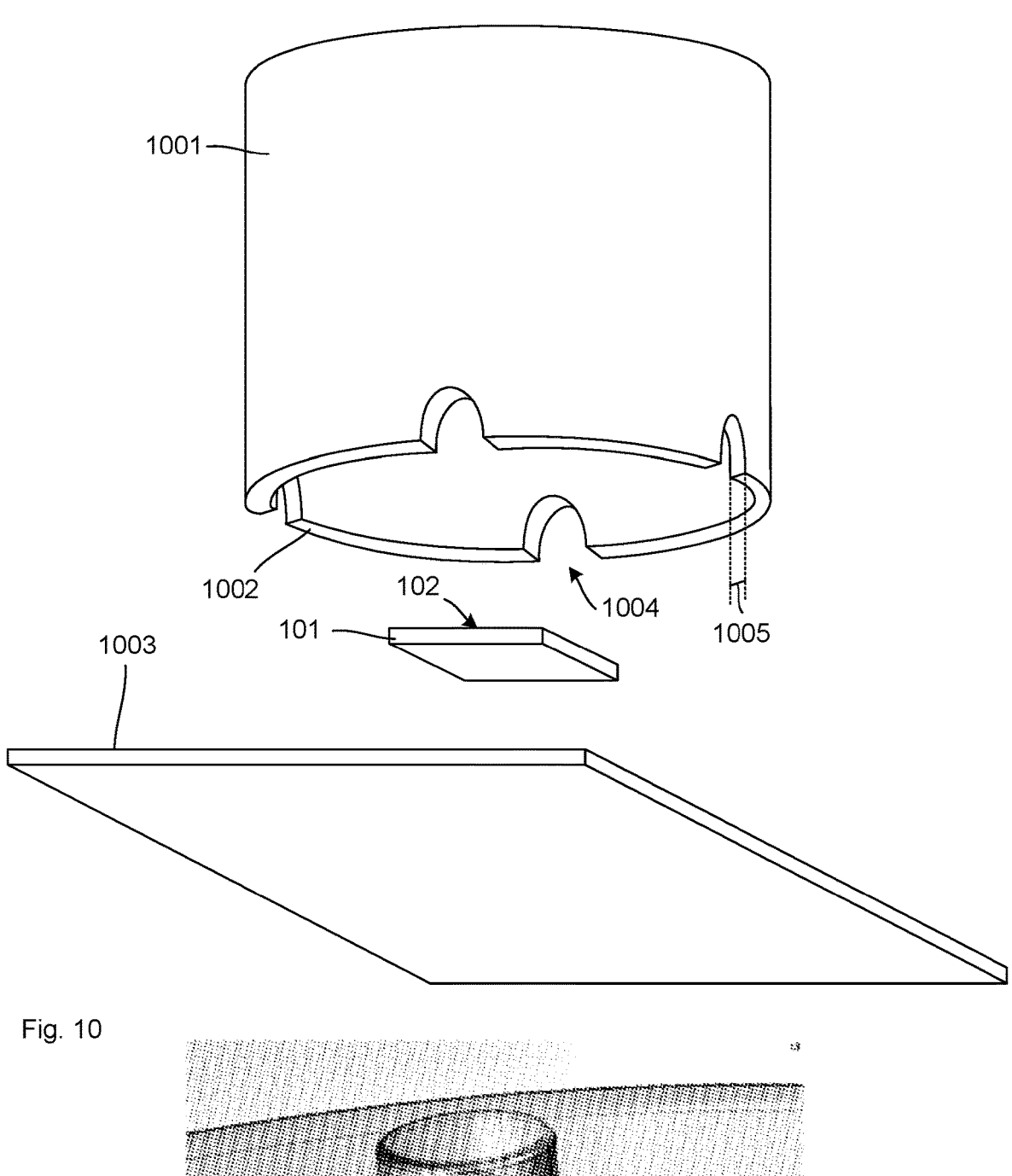
FIG. 10 schematically illustrates a shield that protects a diamond substrate from protons in hydrogen plasma.
FIG. 11 is a rendered 3D view of the shield in FIG. 10.

FIG. 10 schematically illustrates a shield 1001 that protects substrate 101. In FIG. 10 the arrangement is illustrated in an exploded view, noting that, when in use, the substrate 101 and shield 1001 are placed on a base 1003, such that a contact surface 1002 of the shield 1001 forms a seal with base 1003.

Shield 1001 comprises openings, such as opening 1004, to provide for reactive plasma species flow to the diamond surface 102. In the example of FIG. 10, the openings are half-circular and arrange around the bottom edge of the cylindrical shield that is closed at its top. In other words, the shield has the shape of a cup, with half-circular openings around the cup's rim.

Since shield 1001 has a thickness of material, the openings of the shield constitute tunnels having a length indicated at 1005. In this example, the length of the tunnels, that is, the thickness of shield 1001 around the openings, is longer than the diffusion length of the protons. This way, the chemically reactive species produced by the hydrogen plasma can enter the shield 1001 but the protons are kept away from the diamond surface 102. As a result, the diamond surface 102 is hydrogenated to create a conducting surface that provides positive charge carriers.

FIG. 11 illustrates a rendered 3D view of the shield 1001 in FIG. 10.

Figure 12:
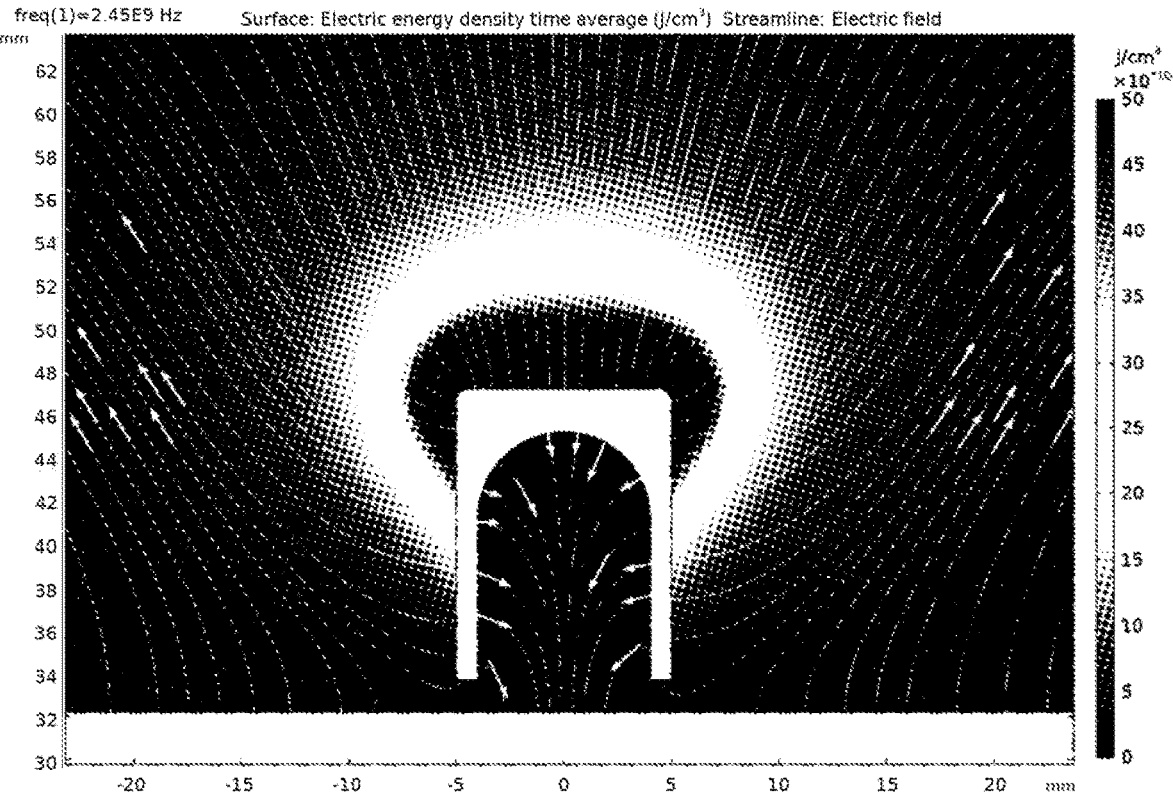
FIG. 12 is a cross-section of the shield.

FIG. 12 is a cross-section of the shield and shows the electric energy density time average as the surface shading in J/cm3, while the streamlines illustrate the electric field. It can be seen that inside the shield, the electric energy is below 5 J/cm3, which should avoid most protons.

Figure 13:
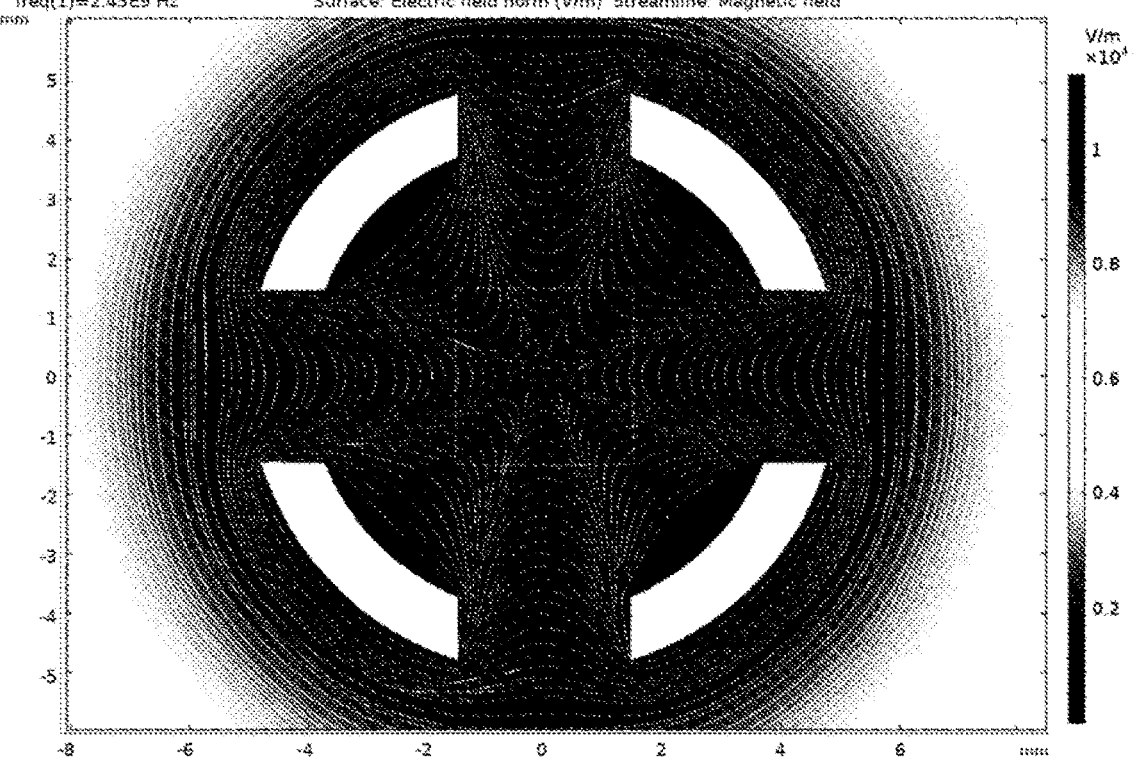
FIG. 13 illustrates a plan view of the shield at the bottom end where the openings are.

FIG. 13 illustrates a plan view of the shield at the bottom end where the openings are. FIG. 13 shows the electric field norm (V/m) and the streamlines show the magnetic field. It can be seen that the shield provides a homogenous and small electric field, while still providing sufficient flow of plasma species through the openings.

In another example, it is possible to achieve suitable hydrogen terminations by inserting the diamond into a hot (e.g., >750 C, <1000 C) controlled atmosphere consisted of Hydrogen gas from 3% to 100% mixed with either Nitrogen or Argon (referred to as a forming gas mixture) for 30 min to 1 hr before removing it (to allow rapid cooling). This is also referred to as annealing in pure hydrogen.

Fabrication and Operating Principles

Figure 14:
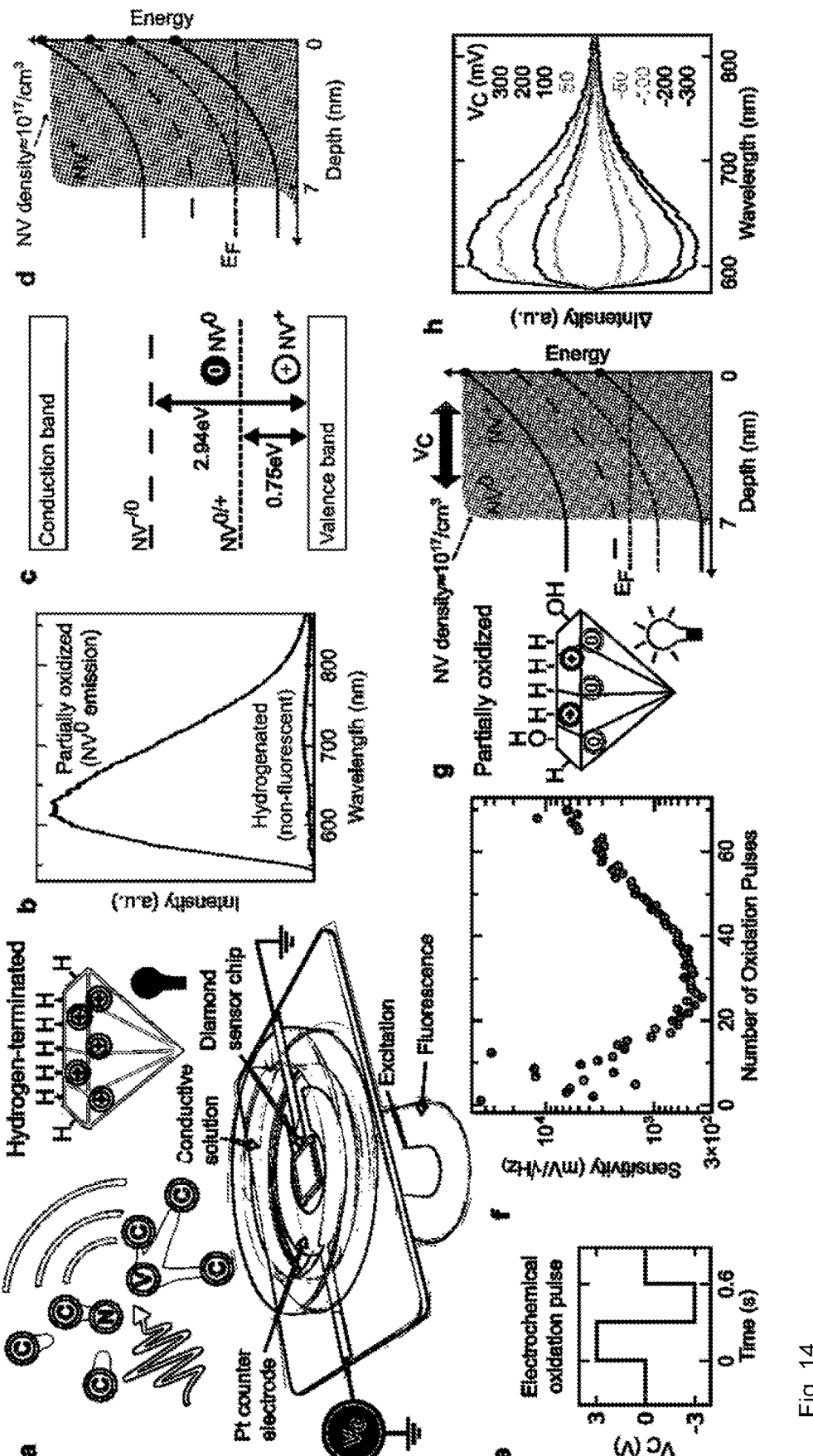
FIG. 14 illustrates principles of diamond voltage imaging microscopy. (a) Illustration of components used in the sensor design: nitrogen-vacancy (NV) defects, hydrogen termination and transparent fluid well with inert counter electrode for solution gating. (b) Extracted NV fluorescence spectra from a hydrogenated (bottom) and partially-oxidized (top) sample showing the near-complete loss of NV emission following hydrogenation and conversion of the ensemble to the dark NV$^+$ state, and (c) the relevant NV charge state transition energies relative to the diamond valence band. (d) Schematic of near-surface band-bending and NV charge state population density (solid fill) for hydrogen-terminated diamond. (e) Electrochemical oxidation pulse used to strip a controlled amount of the hydrogen termination. (f) Voltage sensitivity evolution of a sacrificial diamond sample with electrochemical oxidation of the hydrogenated surface. (g) Electronic configuration, and (h) solution gate voltage dependence of fluorescence emission of a sensor near optimum sensitivity.

Another example device consists of high-density (of order $10^{17}$/cm3) ultra-shallow ($\approx$7 nm) NV ensembles formed by ion implantation into ultra-pure single-crystal diamond wafers. The diamonds are hydrogen-terminated by indirect exposure to hydrogen plasma, which prevents hydrogen passivation of shallow NV centers whilst rendering the diamond surface electrically conductive in atmosphere via the formation of a two-dimensional hole gas. The devices are mounted within the custom-built fluid wells illustrated in FIG. 14*a*, which feature a planar platinum electrode used to apply solution potentials for characterization while fluorescence excitation and collection are simultaneously performed from below. As shown in grey in FIG. 14*b*, hydrogenation of the diamond surface results in the loss of virtually all detectable fluorescence, indicating full conversion of the NV ensemble to the dark $NV^+$ state. The charge-state of an NV center is determined by the position of the Fermi level, $E_F$, relative to the adiabatic charge-state transition energies illustrated in FIG. 14*c*. The layer of negatively charged adsorbates which forms on the hydrogenated surface creates a strong electrostatic field that shifts these transition energies upward relative to $E_F$, a phenomenon referred to as near-surface band-bending (NSBB). The combination of an ultra-shallow NV ensemble and the low bulk defect concentration of the diamond material used enables surface transfer doping to cause appreciable changes in $E_F$, forcing it below the $NV^{0/+}$ transition as illustrated in FIG. 14*d*. Even slightly deeper NV ensembles with the same areal density show some population of $NV^0$ following hydrogenation, which explains why dense ensembles of $NV^+$ were previously thought to be intractable.

Optimizing the performance of the voltage sensor uses a population of fluorescent NV centers whose change in fluorescence in response to an external solution voltage is maximally visible against their own shot noise. It is possible to realize precise control over the $NV^0$ population by pulsed electrochemical oxidation of the diamond surface in phosphate buffered saline (PBS) interleaved with in situ measurements of voltage sensitivity. Each oxidative voltage pulse, shown in FIG. 14*e*, strips a small fraction of hydrogen atoms from the diamond surface, likely replacing them with hydroxyl groups. This reduces the equilibrium density of negative surface adsorbates and therefore the NSBB. As the band-bending is incrementally reduced, the population of the bright $NV^0$ state increases as its adiabatic charge-state transition energy passes through the Fermi level at shallower depths, which alters the fluorescence response of the device to an applied voltage while concurrently increasing the emitted photon shot noise. After each oxidative pulse, the voltage sensitivity n is measured and quantified according to:

$$\eta = \frac{1}{\beta \sqrt{I_0}} \tag{1}$$

where the fluorescence contrast is estimated with the relation $\Delta I/I_0 = \beta \Delta V$, $\Delta I$ is the measured change in fluorescence count rate, $I_0$ is the fluorescence at 0V, and $\Delta V$ is the change in solution potential.

As shown in FIG. 14*f*, the initial surface oxidation pulses increase the fluorescence contrast and $NV^0$ population concurrently until the voltage response plateaus in an optimal sensitivity region. At this point the surface is partially oxidized (FIG. 14*g*, left) with $E_F$ intersecting the $NV^{0/+}$ transition within the shallow implanted region (FIG. 14*g*, right). The partially oxidized diamond surface retains sufficient conductivity to allow for solvated charges to build up within an electrolytic double-layer (EDL) upon application of a solution voltage. As shown experimentally in FIG. 14*h*, positive solution voltages reduce the upward band-bending, increasing the $NV^0$ population and fluorescence intensity, while negative solution voltages have the opposite effect. Integrating the raw spectra reveals a fluorescence response which is well approximated by a linear function across a range of gate voltages of around ±50 mV. For samples oxidized well beyond their maximal sensitivity, we begin to observe NV$^{-/0}$ interconversion. However, the sensitivity of such a configuration is limited by low contrast resulting from spectral overlap between NV$^{-}$ and NV$^{0}$ emissions.

Imaging Microelectrode Charge Injection in Solution

Figure 15:
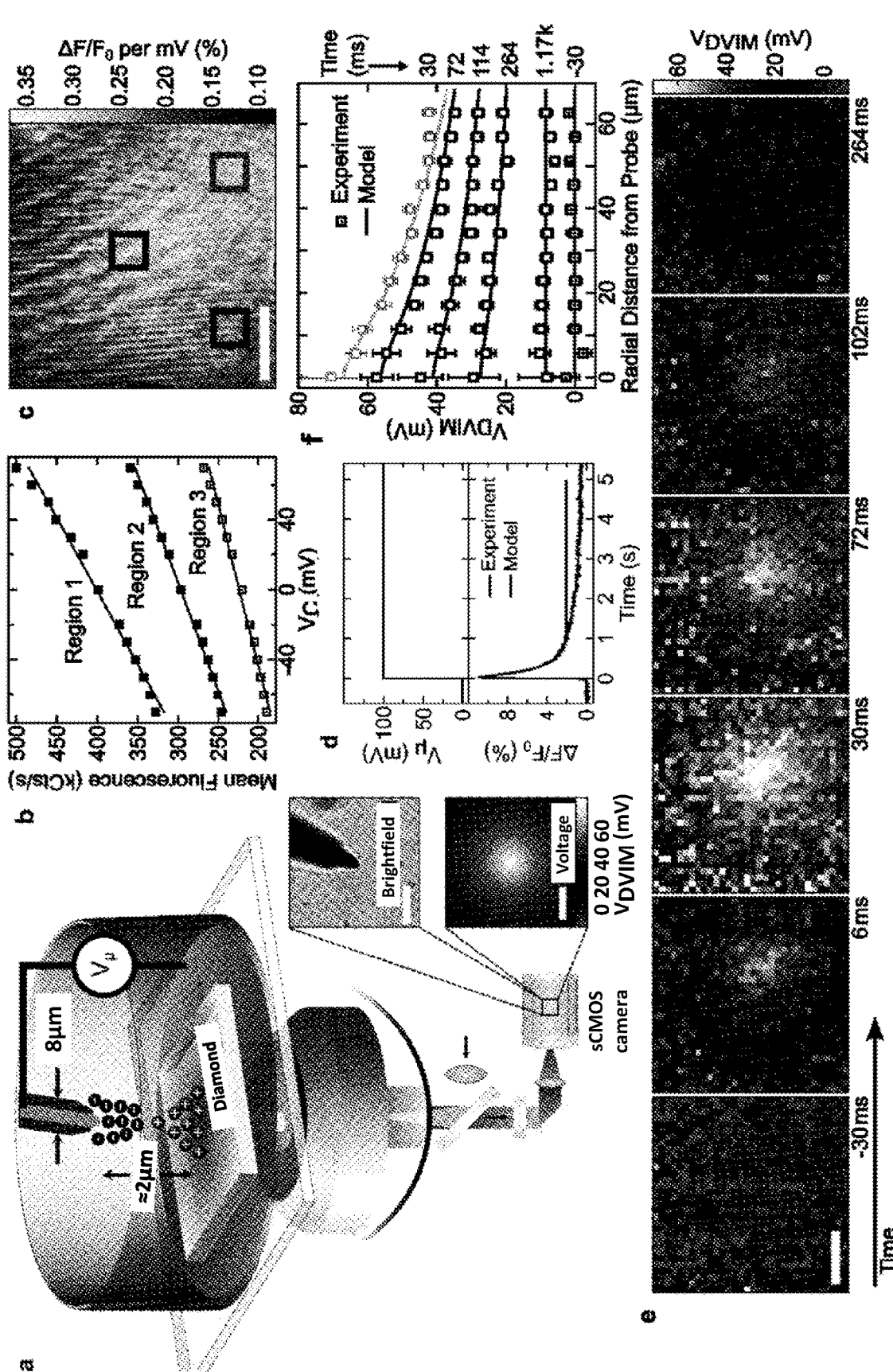
FIG. 15. Imaging microelectrode charge injection dynamics. (a) Schematic of the microelectrode and diamond sensor arrangement. (b) Relative change in fluorescence vs. solution gate voltage amplitude applied using a large Pt counter electrode for three locations on the DVIM surface. (c) A calibration map of the studied region created using the slope of the response curve at each pixel. Highlighted squares indicate the regions analyzed in panel (a). (d) Top: The voltage step applied to the microelectrode. Bottom: the full-frame measured (jagged) and calculated (straight) change in fluorescence following the application of the voltage step. (e) Real-time video recording of changes in local voltage at the diamond surface resulting from a 100 mV step in the microelectrode potential $V_\mu$. (f) Average voltage measured by the DVIM versus radial distance from the electrode tip for selected frames. Error bars are 95% confidence intervals of the measured values. Solid lines show a theoretical model of the experiment. All scale bars are 50 μm. The camera exposure time was 6 ms. These measurements were performed in a dilute saline solution with resistivity >20 kΩcm.

To verify the localized solution voltage imaging capabilities of the DVIM, we used it to image the spatiotemporal voltage transient resulting from the application of a voltage step to a proximal microelectrode. FIG. 15a illustrates the experimental setup: An insulated Pt/Ir microelectrode with an exposed tip diameter of ≈8 μm was positioned as close to the diamond surface as possible without contact in a dilute buffered saline solution. Prior to the measurement of microelectrode signals, the voltage response of the imaged chip area was calibrated using DC voltages applied via the large platinum ring electrode. FIG. 15b demonstrates the DVIM response within a dynamic range of +70 mV, from which linear fits of the responses at each pixel can be used to construct a calibration map as shown in FIG. 15c. A signal generator was used to apply 100 mV between the microelectrode and diamond surface while NV fluorescence was recorded using an inverted widefield fluorescence microscope and an sCMOS camera. This voltage is low enough to ensure the two surfaces behave as ideally polarizable electrodes (negligible Faradaic current flows between the two). The applied voltage signal and corresponding full-frame fluorescence are shown in FIG. 15d.

At time t>0, positive charge begins to accumulate on the diamond surface directly underneath the microelectrode tip, resulting in increased fluorescence. The maximum at t=30 ms occurs when the rate at which charge accumulates at the diamond surface is balanced by the rate at which it is laterally transported out of the field-of-view (FOV) by diffusive processes. For t>30 ms, ions continue spreading radially outward until they are evenly distributed across the diamond surface. Select frames showing the localized buildup and subsequent spreading of charge from under the electrode tip are shown in FIG. 15e. These images were captured at 167 frames/sec with an effective pixel mapping of approximately 5.5 μm and were converted from raw fluorescence images to voltage images using the calibration map in FIG. 15c. FIG. 15f shows radial averages (centered on the microelectrode tip location) of the voltage measured by the DVIM for a selection of times following the voltage step as well as the baseline measurement (red squares, bottom) preceding the step. We found that an equivalent RC circuit model yields very good agreement with our measurements, providing verification that the DVIM accurately reports the underlying solution charge dynamics. Our model contains three parameters: the bulk solution resistivity Ks, the diamond surface capacitance $C_D$, and a specific surface resistance accounting for the tangential flow of charge along the diamond surface $\kappa_D$. These parameters were varied to fit the simulated time dynamics, shown in FIGS. 15d (bottom straight line) and 15f (solid lines), to the experimental results. Values of $C_D$=2.3 μF/cm$^2$, $\kappa_D$=21MΩ and $\kappa_S$=42 kΩ·cm resulted in the best fit to the data. These values are consistent with the previously published estimate for the interfacial capacitance of hydrogenated single-crystal diamond in aqueous electrolyte solution[36] of 2 μF/cm$^2$ and the bulk resistivities of 25-200 kΩ·cm which we measured from similar solution preparations to that employed here.

Characterization of a DVIM Enhanced by Photonic Surface Structuring

Figure 16:
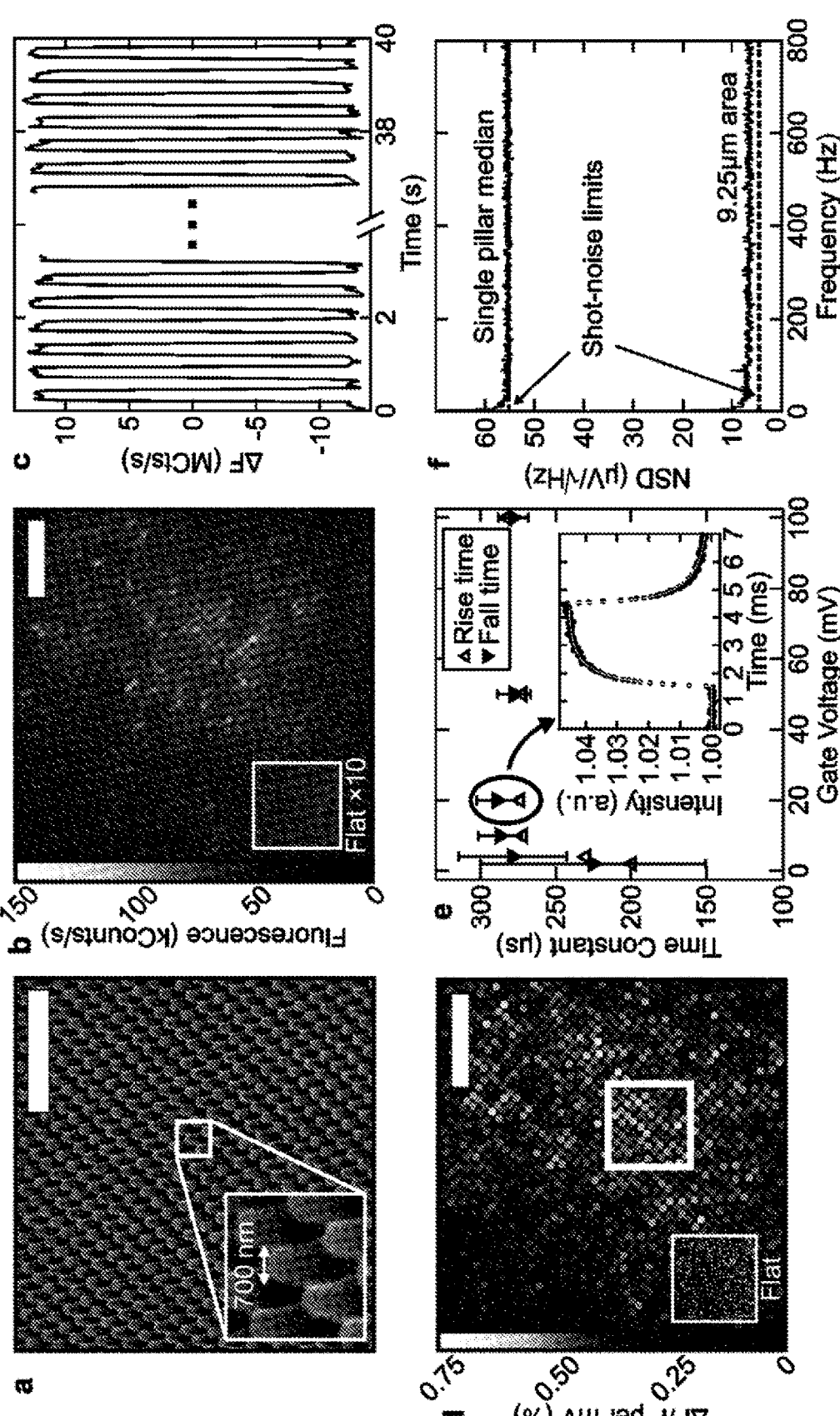
FIG. 16 illustrates the characterization of an example voltage-sensitive diamond optrode array. (a) Scanning-electron micrograph of the fabricated diamond optrodes. (b) Fluorescence image of the optrode array. (c) Change in fluorescence from an approximately 13.74""μm×13.74"" μm section of the array shown in (b) resulting from the application of a 2 Hz, 20 mV square wave voltage in PBS over 40 s. (d) Map of fluorescence responsivity values for each optrode shown in (b). (e) Fluorescence rise and fall time-constants for the optrodes vs. square voltage pulse amplitude in solution. Error bars are one standard error in the fit parameters. Inset: representative response time-trace for a 20 mV pulse. 500 integrations were performed. (f) Noise power spectral densities from a single diamond optrode (top) and the square area highlighted in (d) (bottom). Calculated shot noise limited sensitivities are indicated by dashed lines. Scale bars are 10 μm. These measurements were performed in highly conductive PBS.

Using equation (1), we determine a median per-area sensitivity for the diamond surface of 482 μV·μm/√Hz. To enhance the voltage sensitivity, we implement an approach for increasing light collection by patterning the DVIM surfaces with arrays of nanopillars to act as fluorescence waveguides as described above. FIG. 16a shows a scanning-electron micrograph of a diamond sensor surface with an array of 700 nm diameter pillars produced by reactive-ion etching. As evidenced by FIG. 16b, these diamond 'optrodes' provide a 10-fold increase in photon collection efficiency from our shallow NV$^{0}$ ensembles. Variations in fluorescence intensity from the optrodes shown in the image result from variations in widefield laser excitation, as confirmed by the uniform brightness of the optrodes when observed with scanning confocal microscopy. FIG. 16c demonstrates the photostability of the optrodes, with no degradation of the fluorescence signal amplitude detected over 40 seconds of continuous recording while a 20 mV square wave was applied to the sample in PBS using the platinum ring electrode. We also note that no degradation of sensing performance was observed over the period during which the measurements of this device were performed (>4 months). We confirmed that linearity of the sensor response was preserved following nanofabrication both at the single optrode level and over the aggregate field of view. We observed an increase in the overall fluorescence contrast of the optrodes, shown in FIG. 16d, when compared to the flat surface. This effect was confirmed by measuring the voltage responses of circular test structures spanning two orders of magnitude in diameter which we fabricated on the same diamond sample. Similar contrast improvements have previously been observed in quantum sensing measurements utilizing NV$^{-}$ ensembles and may result from a reduced contribution of out-of-focus fluorescence to the signal due to reduced reflections at the diamond top surface.

To evaluate the temporal response of the DVIM, an avalanche photodiode was used to capture the fluorescence dynamics from the illuminated area upon application of 3 ms square voltage pulses with varying amplitude from the large platinum counter electrode. Unlike the microelectrode measurements described above, here we used a highly conductive buffered saline solution to minimize the RC time constant of the overall circuit. FIG. 16e shows the extracted rise and fall time constants, while the inset displays a representative fluorescence response time-trace. These responses are well fit by exponential functions and yield time constants consistent with capacitive charging of the diamond surface rather than NV charge state transition rates, which are expected to be <1 μs. As this charging time is limited by the diamond surface resistivity, it could be reduced in future devices by fabricating surface electrical contacts closer to the sensing region. The measured fluorescence response time of <300 μs corresponds to a maximal operating frequency of around 3 kHz. This knowledge allows us to reliably measure the noise spectral density of the DVIM while operating our camera at its highest possible framerate (over 128×128 pixels) of 1.6 kHz. FIG. 16f displays the noise spectral density of a single optrode and a 9.25 μm×9.25 μm area (white square in FIG. 16d). Above ≈10 Hz, the measured noise floors show no apparent dependence on frequency and are consistent with the photon shot noise limits predicted by equation (1), which are denoted by dashed lines.

DVIM Sensitivity

Figure 17:
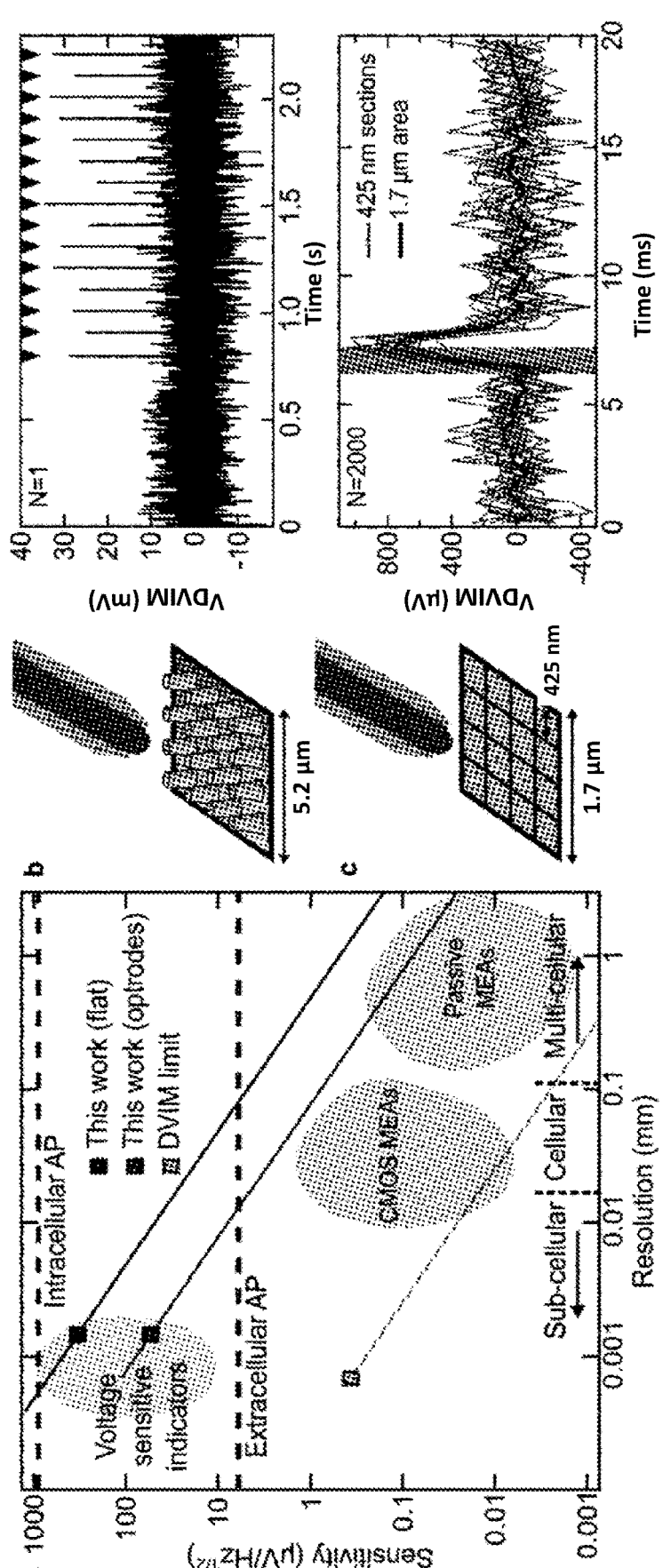
FIG. 17. Comparison to other neuronal voltage imaging technology and demonstration of fast signal detection. (a) Comparison of voltage sensitivities and signal detection thresholds at 1 KHz. Data points represent best measured sensitives of flat (top) and nano-patterned (middle) DVIMs and the theoretical best sensitivity of a DVIM (bottom). Solid lines show the scaling of sensitivity with interrogated area (resolution) to assist with comparison to other technologies. Dashed horizontal lines show estimated detection thresholds for intracellular (top) and extracellular (middle) mammalian neuronal action potentials. Shaded regions roughly indicate the sensitivity and resolution regimes available to current high-speed voltage imaging technologies. (b) Detection of 1 ms square voltage pulses applied with a platinum microelectrode at a repetition rate of 10 Hz by a 4×4 array of optrodes (effective resolution of 5.2 μm). Triangles indicate the rising edges of the applied pulses. (c) Detection of 1 ms square pulses with sub-mV amplitude and 425 nm resolution by repeated integration on a 1.7 μm×1.7 μm section of a flat DVIM chip. The shaded region indicates the duration of the applied pulse. All displayed traces are unfiltered.

From the measured noise power spectra, we obtain a sensitivity of 55 $\mu V/\sqrt{Hz}$ per optrode or 77 $\mu V \cdot \mu m/\sqrt{Hz}$, accounting for the inter-pillar pitch of 1.4 $\mu m$. This value, more than 6 times the sensitivity of the un-patterned area of the same sample, could be further improved to 42 $\mu V \cdot \mu m/\sqrt{Hz}$ by reducing the pitch to 900 nm and utilizing hexagonal close-packed arrays in future devices. Diamond nanopillar structures are particularly attractive for electrophysiological applications due to their ability to facilitate close contact with cultured neurons. With this use case in mind, FIG. 17*a* compares our measured optrode sensitivities to established technologies for voltage imaging of neuronal cultures in vitro. The sensitivity of DVIM technology (two top lines) lies below the threshold for intracellular neuronal recording at single-optrode resolution, but is not presently sufficient for (real-time) high-resolution extracellular measurements. To gauge the prospects for voltage sensing using charge state modulation of diamond color centers, we estimate a technologically feasible upper limit on the sensitivity of a single diamond optrode using $NV^{0/+}$ sensing (bottom line) based on the implementation of material and apparatus optimizations. The limit of sensitivity using charge state interconversion between $NV^0$ and $NV^+$ of around 375 $nV/\sqrt{Hz}$ for a single optrode offers more than one order of magnitude greater spatial resolution. In addition, our optical readout mechanism is not subject to the same restrictions on the total number of active recording channels as MEAs, potentially allowing higher volumes of information to be extracted from dense neuronal cultures.

To model local bioelectrical charge injection and verify our calculated sensitivities, we developed a protocol to generate voltage signals at the diamond surface with timescales and amplitudes commensurate with neuronal activity. This was achieved in three steps: First, a micromanipulator was used to maneuver a platinum/iridium microelectrode to within 2 $\mu m$ of the sensor surface. Secondly, the solution conductivity was adjusted from pure deionized water by adding PBS until signals applied by the microelectrode elicited a sub-millisecond fluorescence response. Finally, to compensate for the shunting of injected charge to the solution ground and the spatial fall-off of the signal produced by the microelectrode, the amplitude of the applied voltage signal was increased until potential changes equivalent to measured intracellular action potential events were detected. FIG. 17*b* shows the detection of 30 mV, 1 ms square voltage pulses applied at a 10 Hz repetition rate (400 mV applied to the microelectrode) over a 4×4 optrode array. This restricted area (5.6 $\mu m$×5.6 $\mu m$) allowed for a camera recording rate of 2 kHz, sufficient to observe sub-millisecond fluorescence response times. We also note that the applied signal was resolvable at the single-optrode level. To demonstrate that sub-millivolt detection is presently only limited by photon shot noise, we gated our measurements to the applied signals and averaged the results over several trials, a practice for which precedent exists for high-resolution mapping of extracellular signal propagation. FIG. 17*c* shows the resulting detected voltage traces integrated over a flat region (1.7 $\mu m$×1.7 $\mu m$), indicating a peak voltage of less than 800 $\mu V$ at the sensor surface (5 mV applied to the microelectrode). The region of interest can also be broken into sixteen 425 nm sub-regions, thereby demonstrating voltage recording with sub-micron resolution. This represents a 20 times improvement over current HD-MEA systems and is less than twice the diffraction limit of our microscopy apparatus ($\approx$230 nm).

The averaged result of 2000 trials is shown in FIG. 17*c* for clarity, but we note that the signal was resolvable after only around 200 trials.

CONCLUSION

This disclosure provides an optical voltage imaging sensor with a quantitative linear response utilizing the transitions of diamond NV centers between their neutral and positive charge states. The method may comprise tailored control over the NV ensemble charge state populations via electrochemical tuning of the diamond surface termination. This technology circumvents the need for on-chip readout circuitry, enabling resolutions more than twenty times higher than CMOS HD-MEAs while enabling parallel readout from, in principle, as many channels as there are pixels available on modern scientific cameras (>1 million). Diamond voltage imaging microscopy can be immediately utilized in fundamental studies where the complex electrokinetic dynamics of diffuse liquids preclude or complicate the use of single-point probe measurements, and may enable time-resolved imaging studies of battery systems.

On the near-term horizon, our demonstration that nanopillar waveguides enhance sensitivity, combined with the previously demonstrated biocompatibility of similar diamond structures with neuronal cultures, suggests that optrodes with diameters below 200 nm may be used to enable intracellular access for electrophysiological recording. Practical application of this technique to electrophysiology will likely require adhesion-promoting coatings to improve cell survival rates and enhance signal strength via biological seal resistance. The cationic nature of these coatings could conceivably cause changes to near-surface NV responses, however our testing has shown no deleterious effects. Long-term photostability, the rapid response of NV emissions, and the transparency of diamond make DVIMs an attractive platform for future studies of neuronal network formation and function, where the transparent substrate can be leveraged to enable multi-modal voltage imaging with, for instance, transcriptional, structural, or metabolomic tags, as well as all-optical closed-loop systems utilizing optogenetic stimulation. This technology may enable extracellular imaging of neuronal network dynamics with sub-micron resolution.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An electrical field sensor comprising:
   a diamond substrate with a conducting surface providing positive charge carriers;
   multiple defects disposed in the diamond substrate at a density to create a sensing surface suitable for imaging; and
   an optical apparatus to initialize and readout the multiple defects to determine the electrical field based on a detected fluorescence of the multiple defects by imaging photoluminescence emissions from the multiple defects;
   wherein the multiple defects are located at a depth below the surface to enable the positive charge carriers to reach and positively charge the multiple defects under an influence of an external negative electric field to thereby alter the fluorescence of at least some of the multiple defects.

2. The electrical field sensor of claim 1, wherein the multiple defects comprise Nitrogen vacancies.

3. The electrical field sensor of claim 1, wherein the conducting surface comprises a layer of hydrogen that provides the positive charge carriers.

4. The electrical field sensor of claim 3, wherein the hydrogen is partially oxidized to increase a sensitivity of the electrical field sensor.

5. The electrical field sensor of claim 1, wherein the optical apparatus comprises a light source configured to excite the multiple defects and a photo sensor camera to sense light emitted by the multiple defects as a result of the fluorescence.

6. The electric field sensor of claim 1, wherein the multiple defects are located at a depth of less than 7 nm below the surface.

7. The electric field sensor of claim 1, wherein the multiple defects are disposed in the diamond substrate at a density of 3e20 cm3 to 1e19 cm3.

8. The electric field sensor of claim 7, wherein the density is 2e20 cm3.

9. The electric field sensor of claim 1, wherein the positive charge carriers are provided by the conducting surface at a density of at least 1e13 cm2.

10. The electric field sensor of claim 1, wherein the diamond substrate and the conducting surface have a shape defining an array of protrusions and the optical apparatus is configured to readout each of the protrusions separately to obtain one intensity for each protrusion.

11. The electric field sensor of claim 10, wherein the protrusions have a frustoconical shape and wherein the protrusions are shaped with a density of protrusions of 510,000/mm2 or a resolution of 1.4 μm.

12. A method for manufacturing an electric field sensor, the method comprising:

providing a diamond substrate;

incorporating defects into the diamond substrate at a density to create a sensing surface suitable for imaging;

disposing a conducting surface providing positive charge carriers onto the diamond substrate with incorporated defects;

wherein disposing the conducting surface is performed with a process that avoids diffusion into the diamond substrate and maintains the defects that are located at a depth below the surface to enable the positive charge carriers to reach and positively charge the multiple defects under an influence of an external negative electric field to thereby alter the fluorescence of at least some of the multiple defects.

13. The method of claim 12, wherein disposing the conducting surface comprises exposing the diamond surface to a hydrogen plasma.

14. The method of claim 13, wherein exposing the diamond surface to the hydrogen plasma comprises protecting the diamond surface from impact of protons reacting with the defects.

15. The method of claim 14, wherein protecting the diamond surface comprises placing the diamond surface under a shield to protect the diamond surface.

16. The method of claim 15, wherein the shield comprises openings to provide for plasma flow to the diamond surface.

17. The method of claim 15, wherein the openings of the shield constitute tunnels having a length that is longer than a diffusion length of the protons.

18. The method of claim 12, wherein the method further comprises partly oxidising the conductive surface on the diamond substrate.

19. The method of claim 18, wherein partly oxidising the conductive surface comprises multiple iterations of:

partly oxidising the conductive surface, and measuring a sensitivity of the electric field sensor, until a desired sensitivity is obtained.

20. A method for measuring an electrical field, the method comprising:

exposing a diamond substrate with a conducting surface providing positive charge carriers to the electric field; and optically initialising using a light source and imaging photoluminescence emissions from multiple defects disposed in the diamond substrate at a density to create a sensing surface suitable for imaging to measure, by measuring a change in fluorescence, an increase in an amount of positively charged defects as a result of more positive charge carriers reaching the multiple defects due to the electric field.

* * * * *